United States Patent [19]

Vandierendonck et al.

[11] 3,987,416

[45] Oct. 19, 1976

[54] ELECTRONIC CALCULATOR WITH DISPLAY AND KEYBOARD SCANNING SIGNAL GENERATOR IN DATA MEMORY

[76] Inventors: Jerry L. Vandierendonck, 645 Glenwood Cutoff, Santa Cruz, Calif. 95060; Roger J. Fisher, 2601 Marilee, Houston, Tex. 77002; Glenn A. Hartsell, 7215 Roundrock Road, Dallas, Tex. 75240

[22] Filed: Sept. 24, 1973

[21] Appl. No.: 400,437

[52] U.S. Cl. ............................ 340/172.5; 340/365 S
[51] Int. Cl.² ............................................. G06F 3/00
[58] Field of Search .......... 340/172.5, 324 R, 365 S; 235/156, 159, 160, 164

[56] References Cited
UNITED STATES PATENTS

| | | | |
|---|---|---|---|
| 3,623,082 | 11/1971 | Stein et al. | 340/365 S |
| 3,631,403 | 12/1971 | Asbo et al. | 340/172.5 |
| 3,639,742 | 2/1972 | Drage et al. | 235/160 |
| 3,676,656 | 7/1972 | Schmidt | 235/156 |
| 3,688,263 | 8/1972 | Balogh, Jr. et al. | 340/172.5 |
| 3,702,988 | 11/1972 | Haney et al. | 340/172.5 |
| 3,745,536 | 7/1973 | Klehm, Jr. | 340/172.5 |
| 3,748,452 | 7/1973 | Ruben | 340/172.5 X |
| 3,757,308 | 9/1973 | Fosdick | 340/172.5 |
| 3,760,171 | 9/1973 | Wang et al. | 340/172.5 X |
| 3,781,852 | 12/1973 | White et al. | 340/172.5 X |
| 3,800,129 | 3/1974 | Umstattd | 235/156 |

*Primary Examiner*—Gareth D. Shaw
*Assistant Examiner*—Melvin B. Chapnick

[57] ABSTRACT

An electronic calculator system of the type having a keyboard input and a visual display readout is implemented in MOS/LSI semiconductor chips having a data memory, an arithmetic unit, a read-only-memory for storing instruction words, and control circuitry for operating the system in response to keyboard inputs, all in monolithic semiconductor units. The keyboard and display are scanned by timing signals generated in the semiconductor unit by a register associated with the data memory.

25 Claims, No Drawings

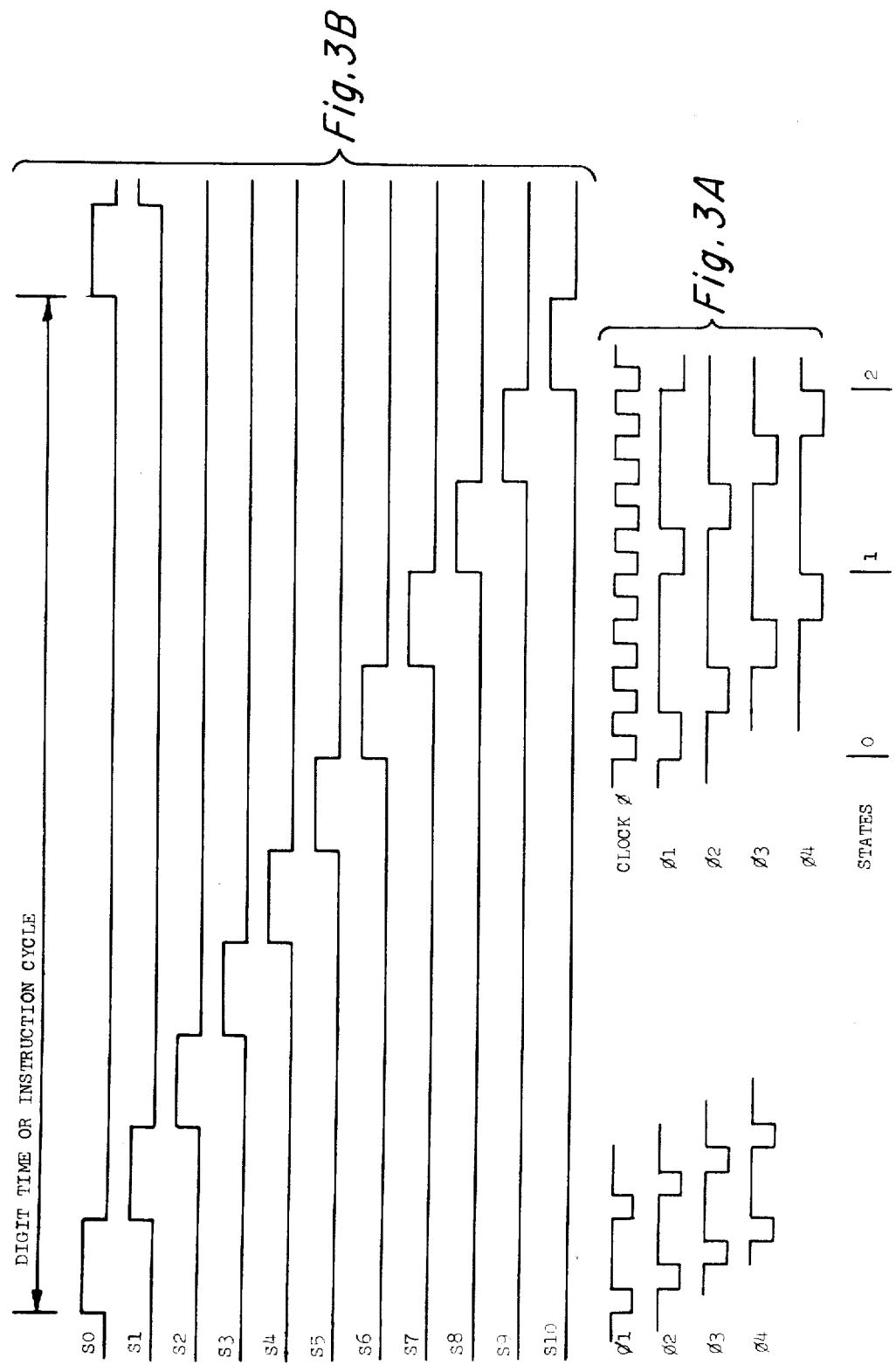

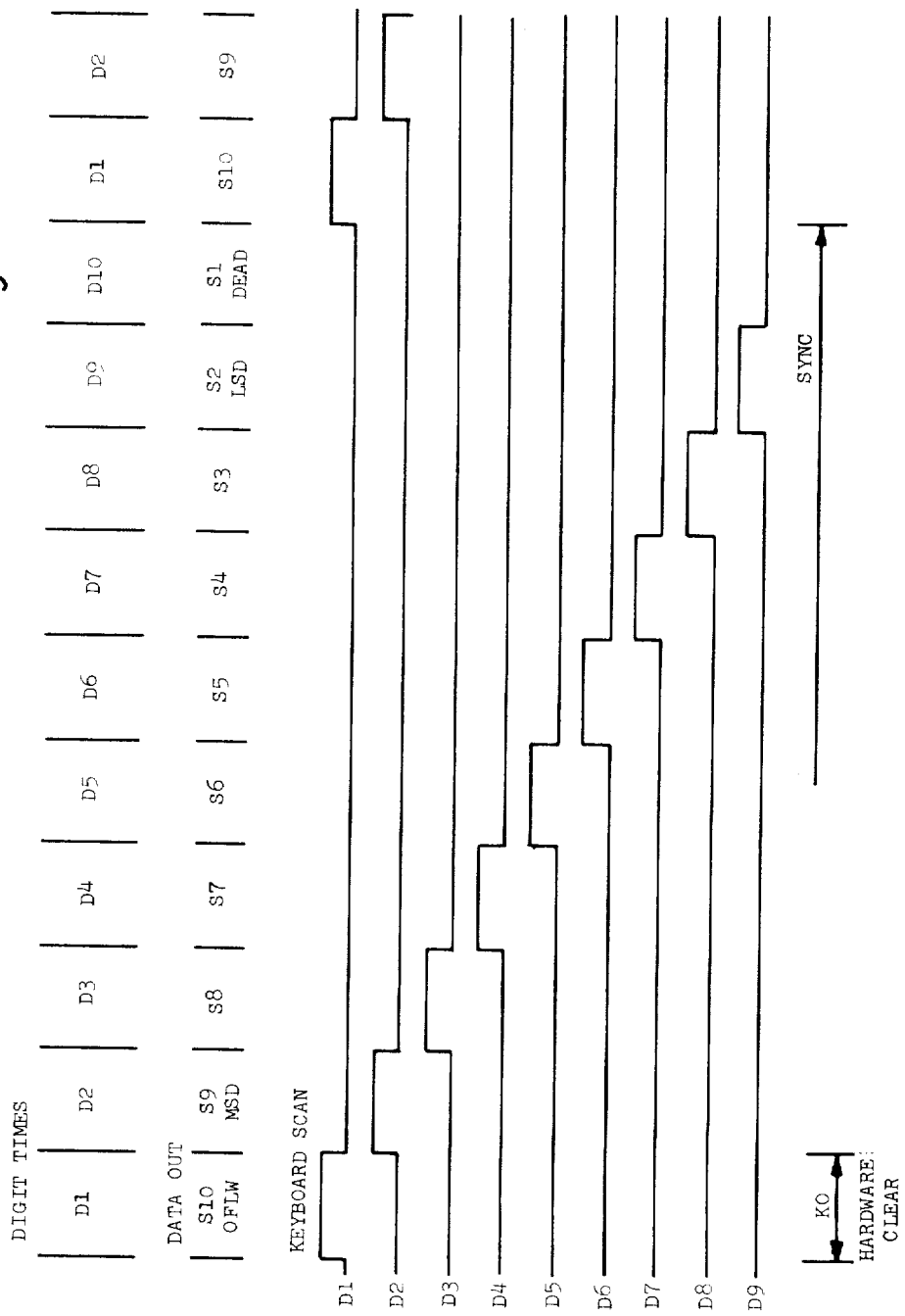

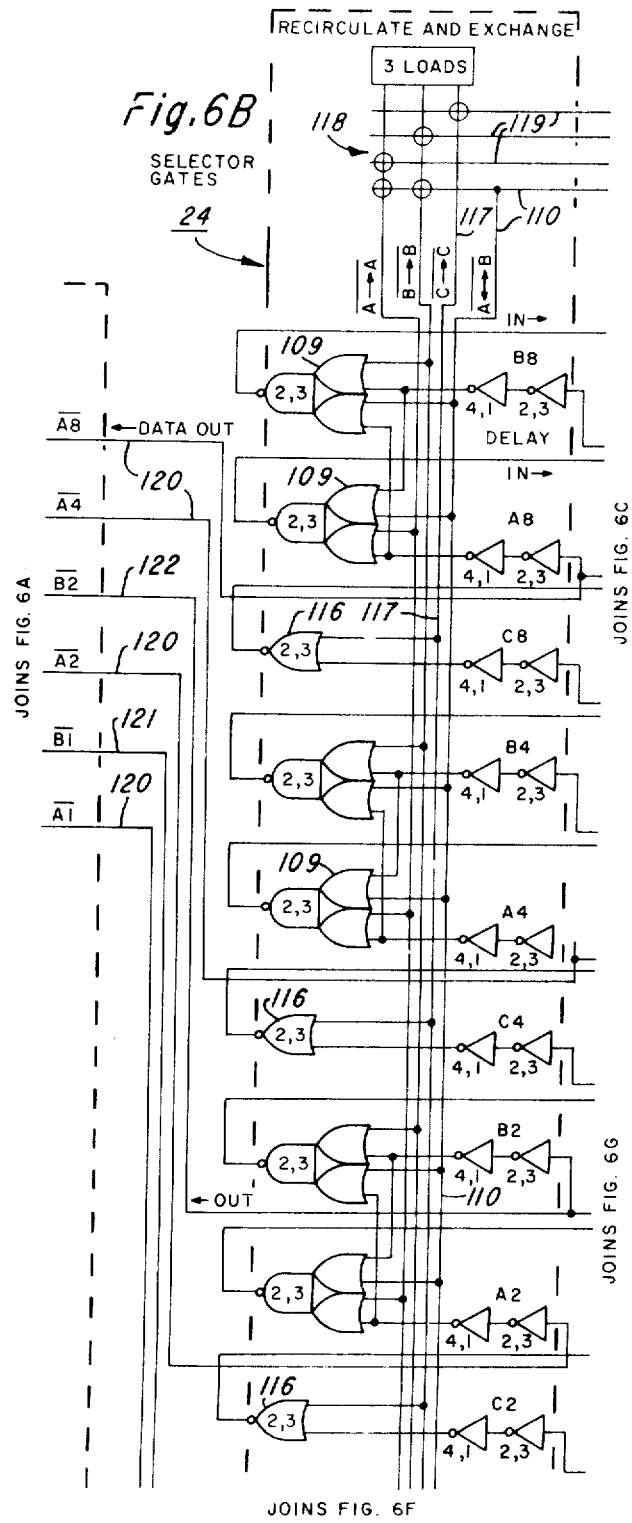

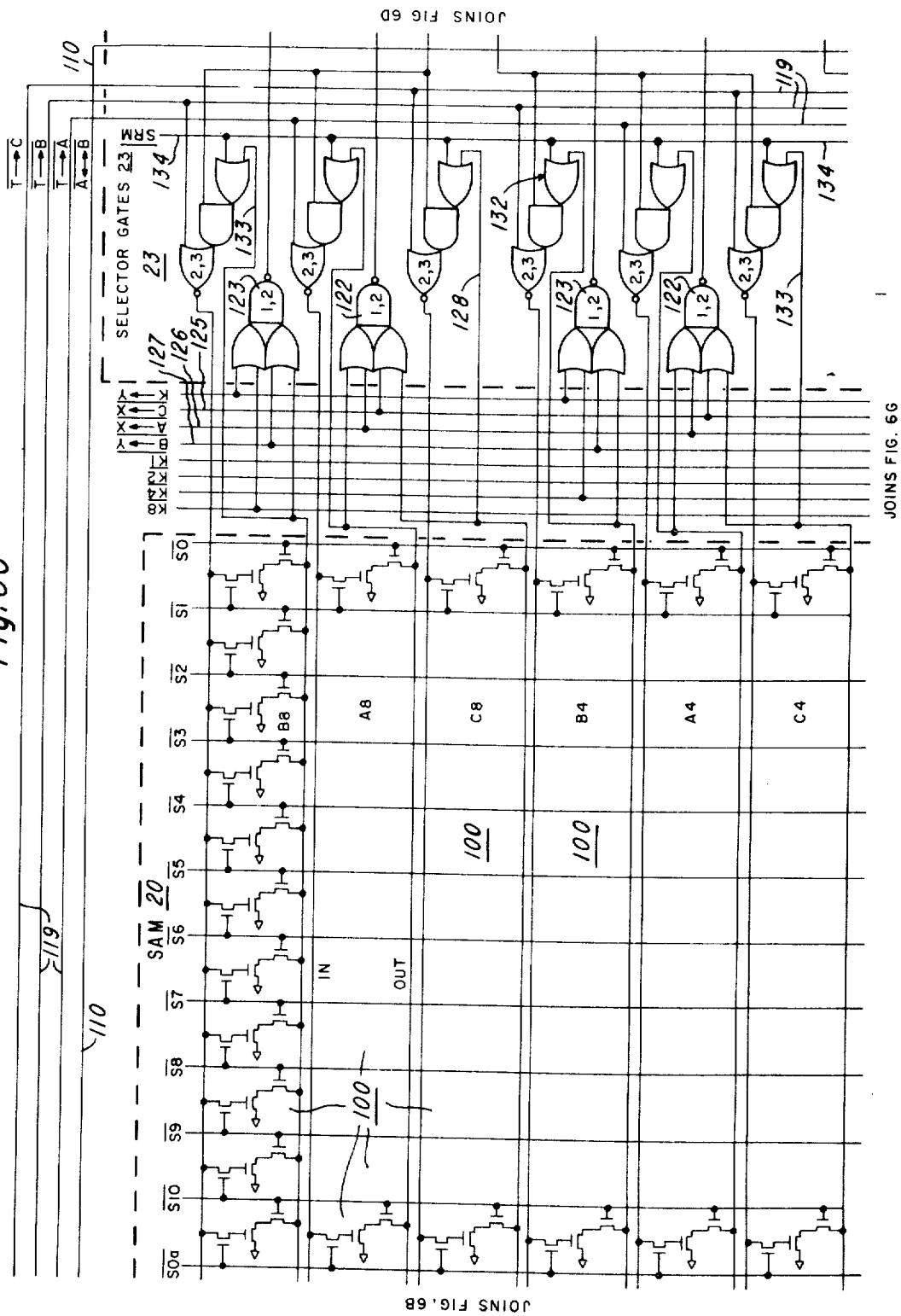

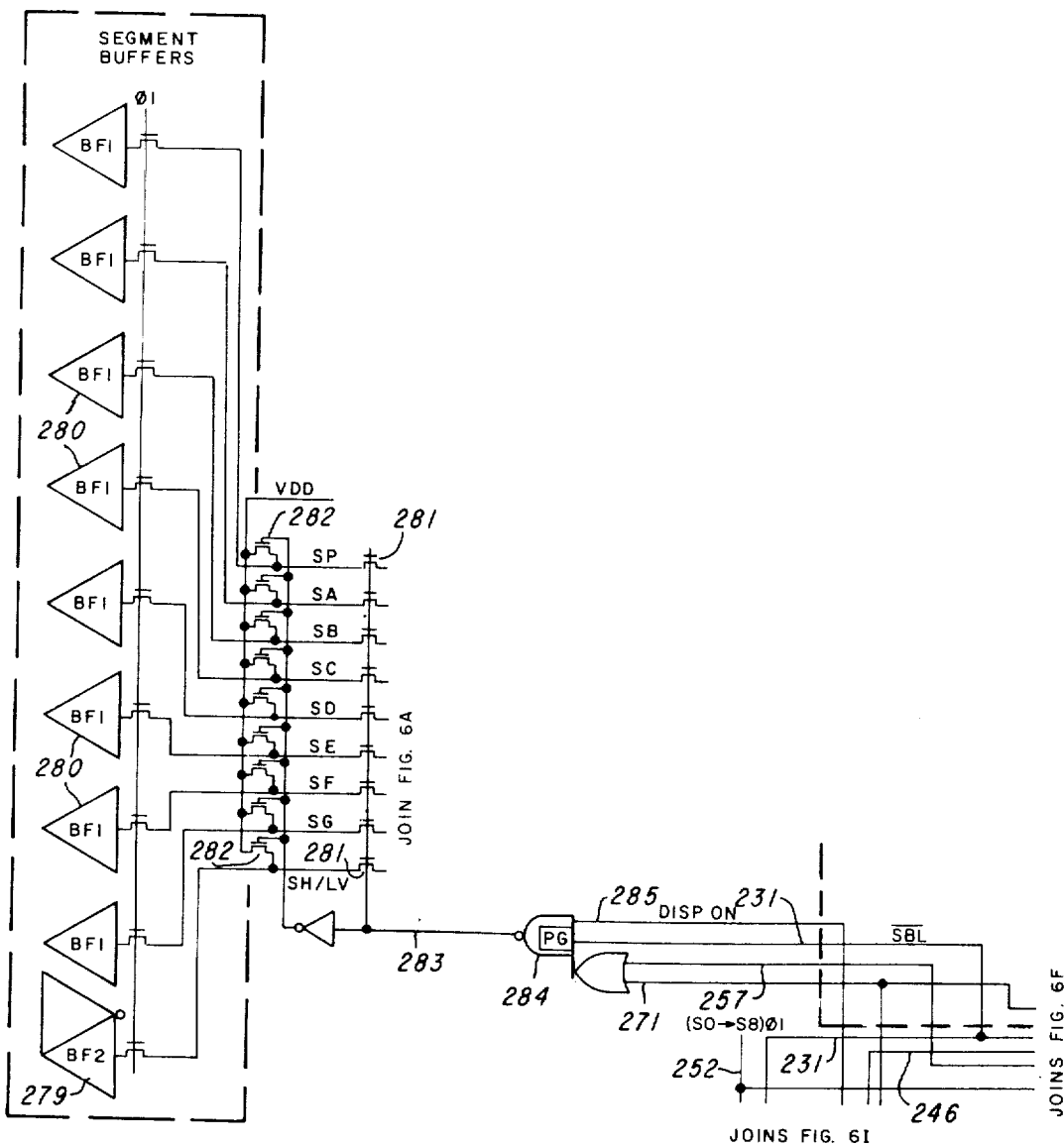

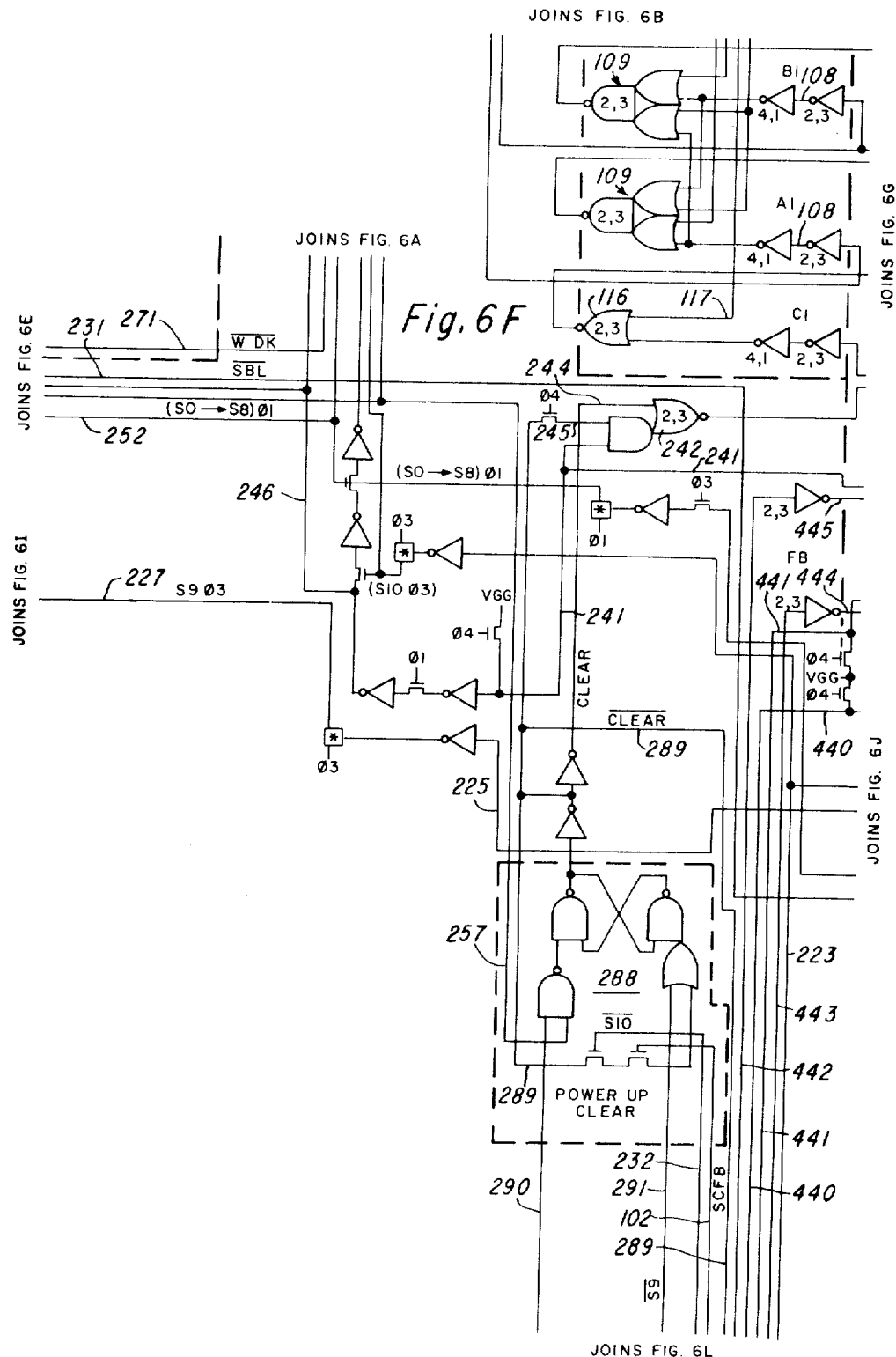

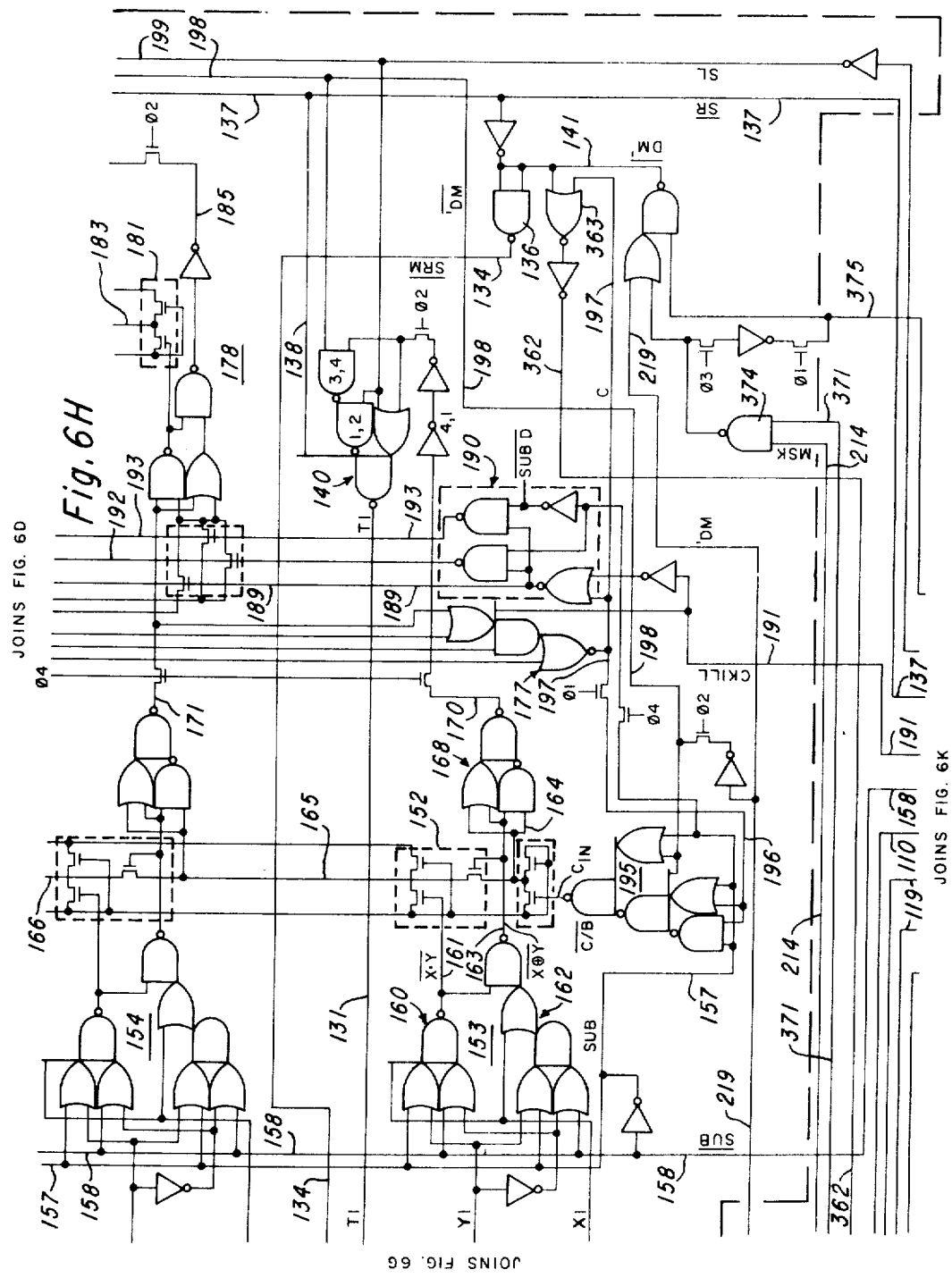

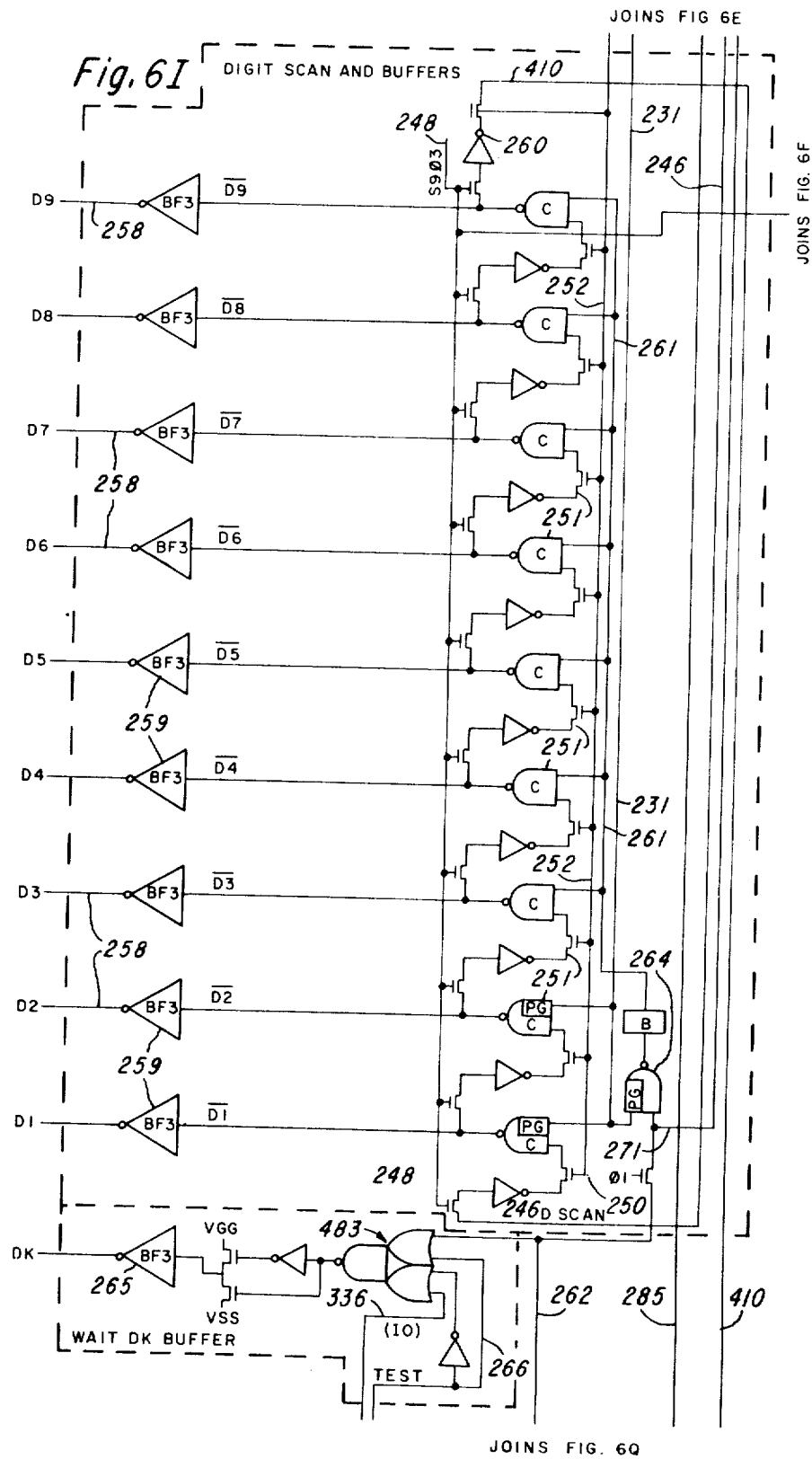

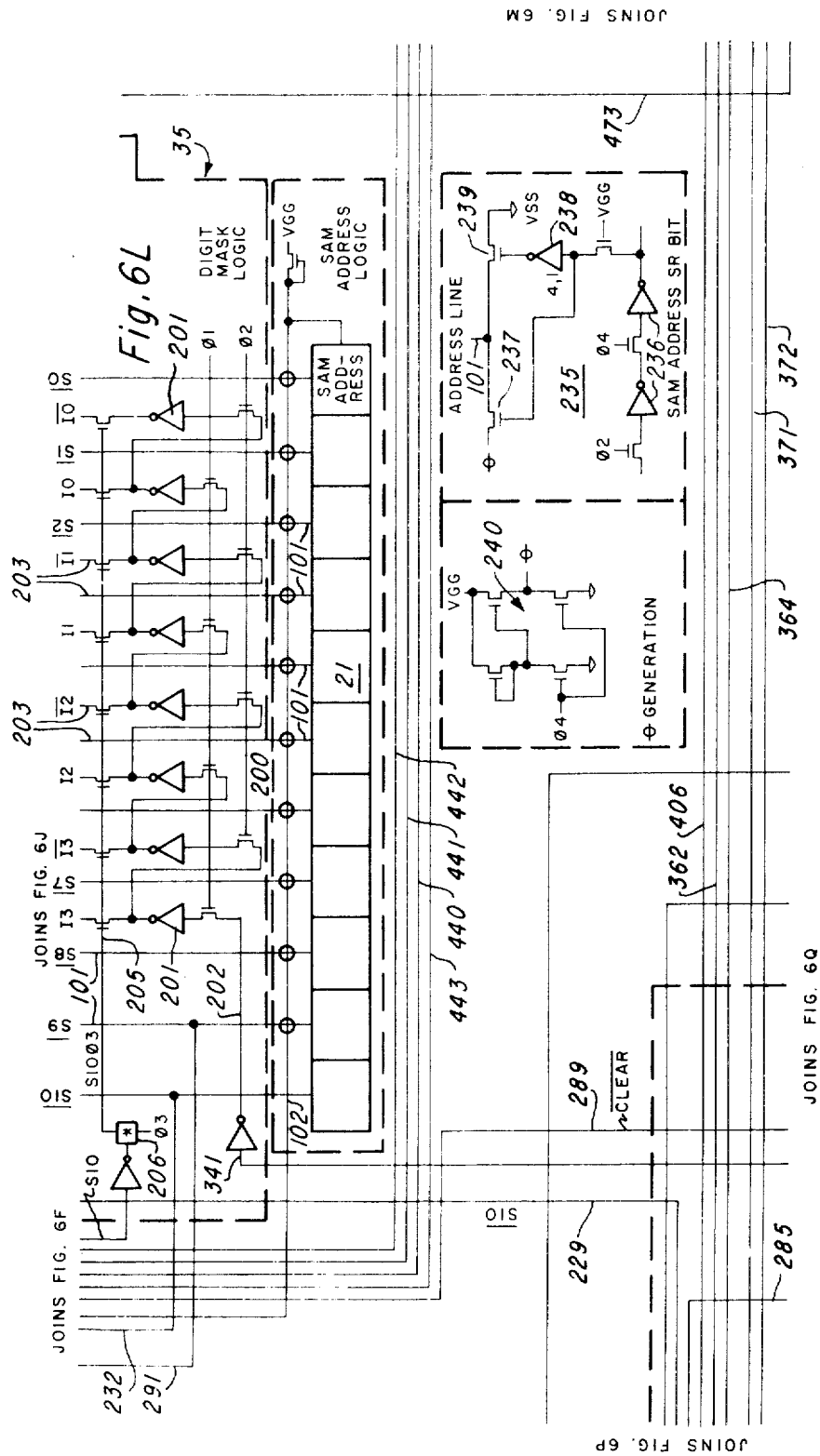

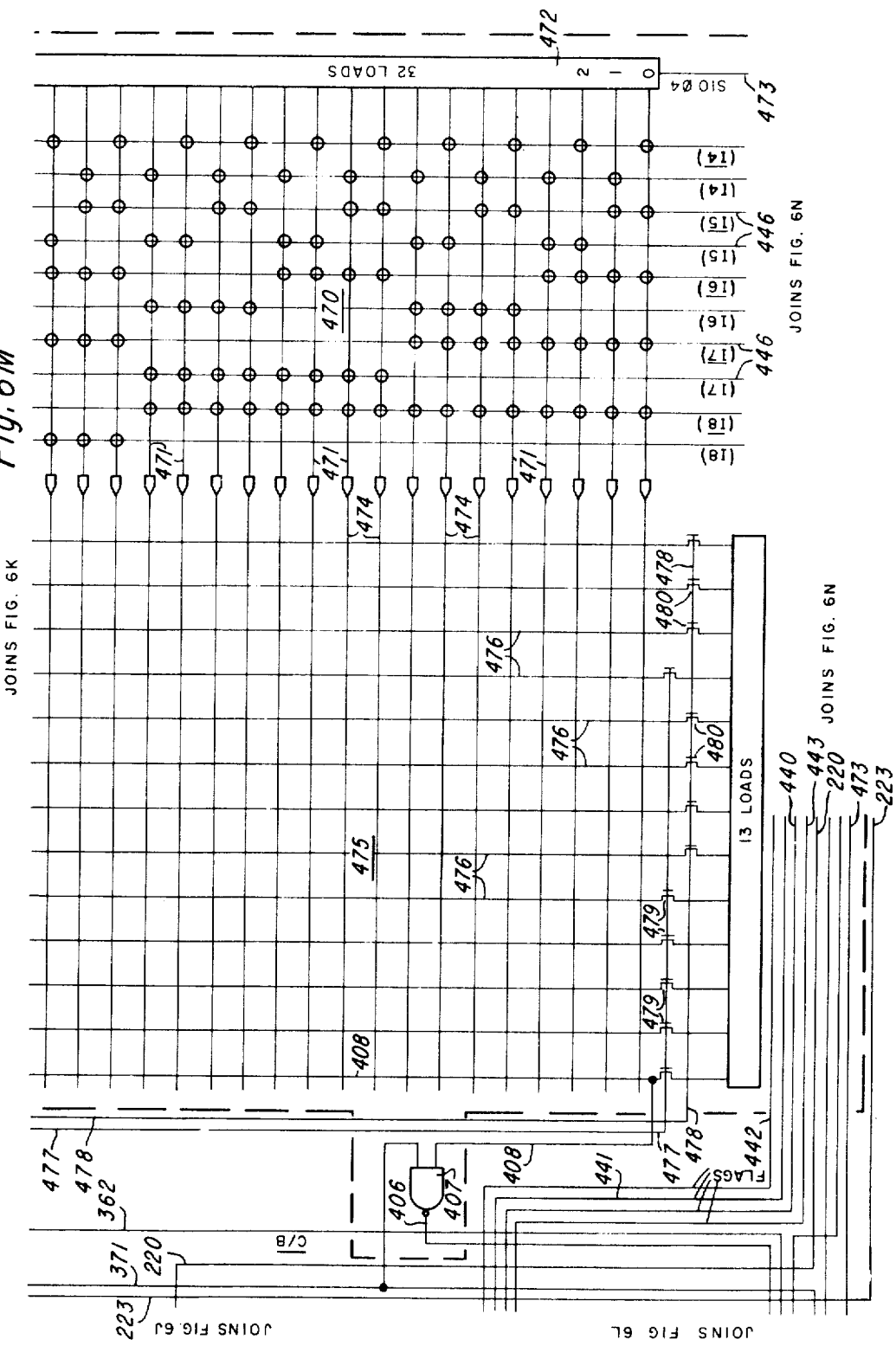

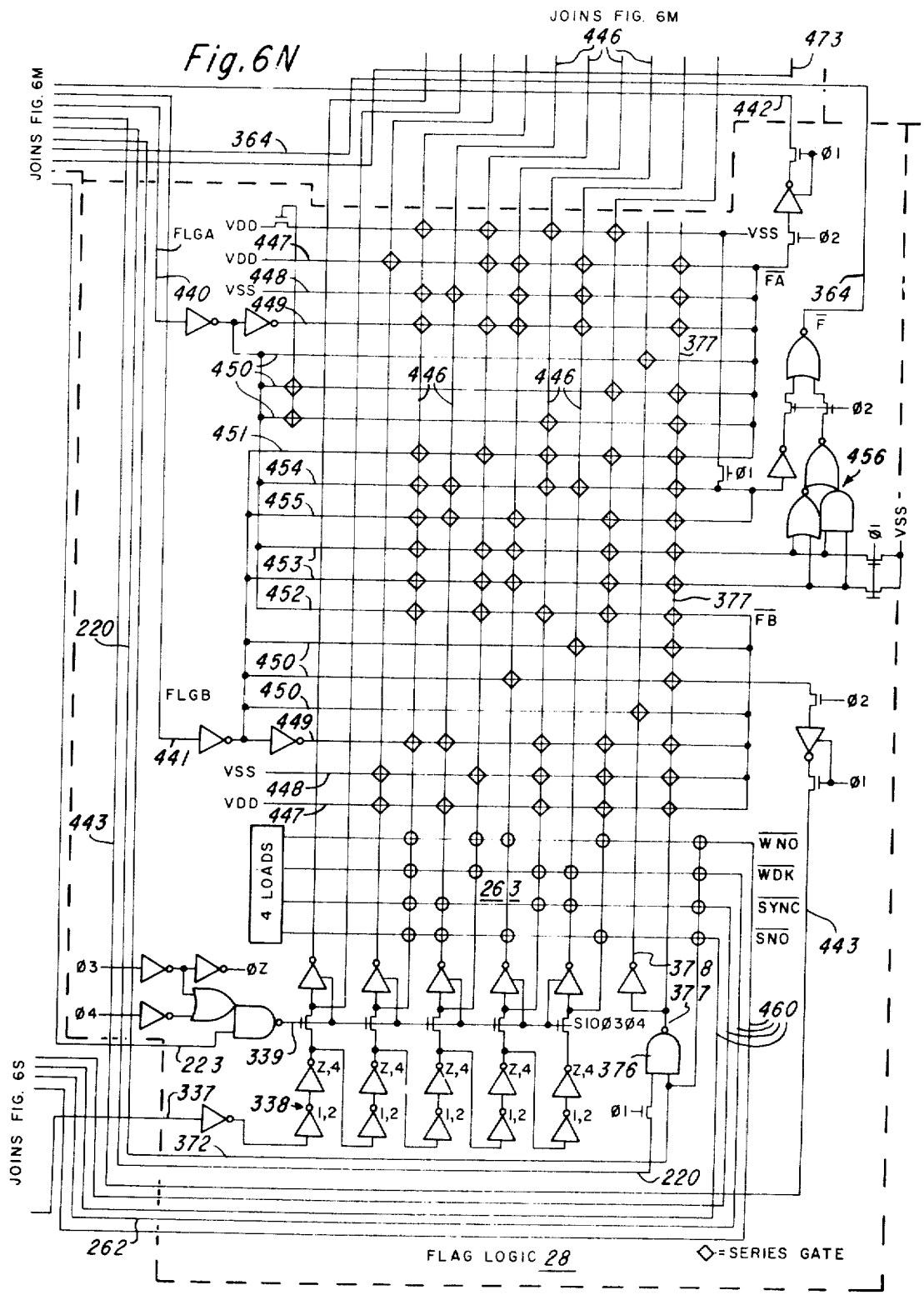

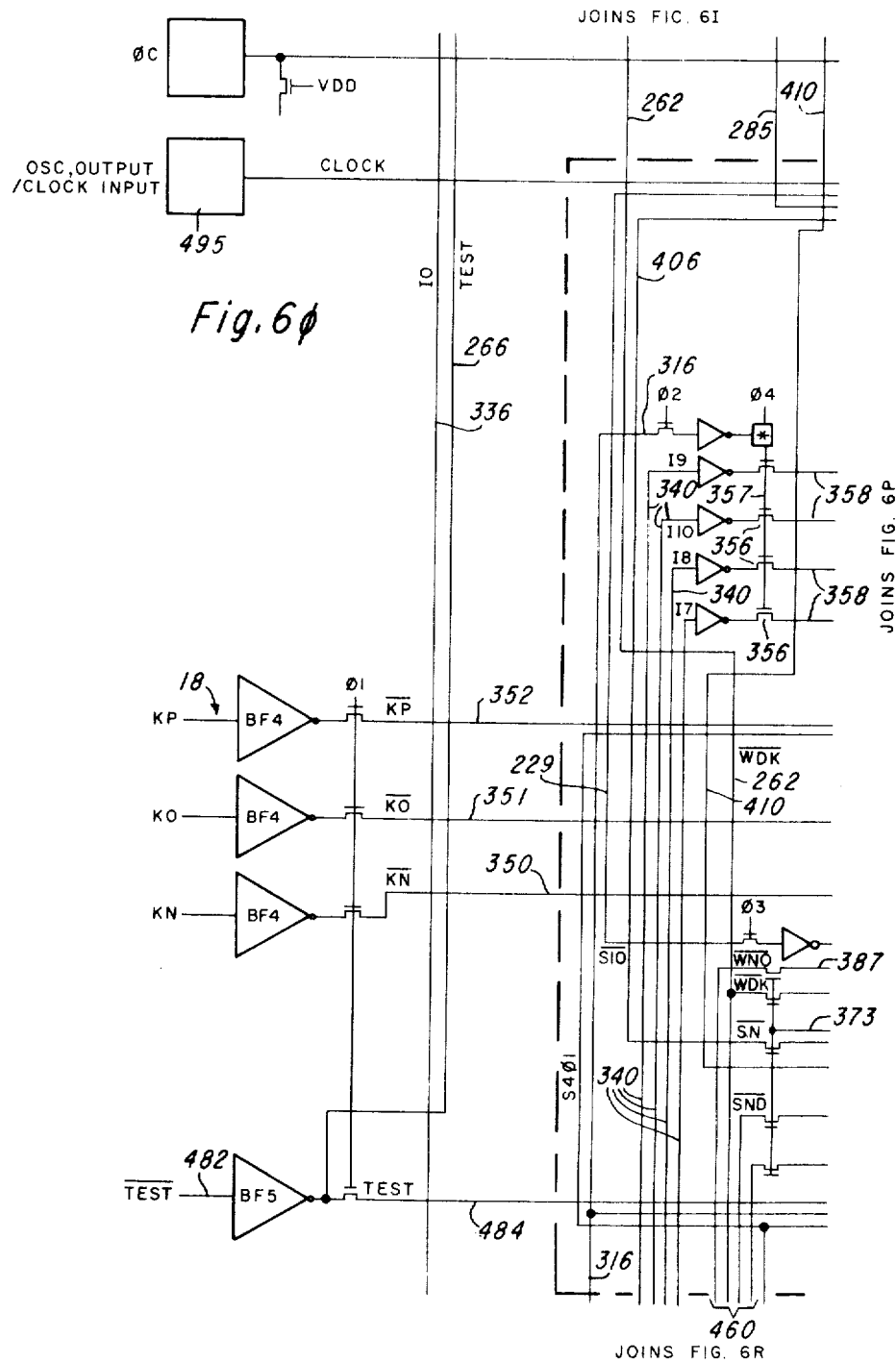

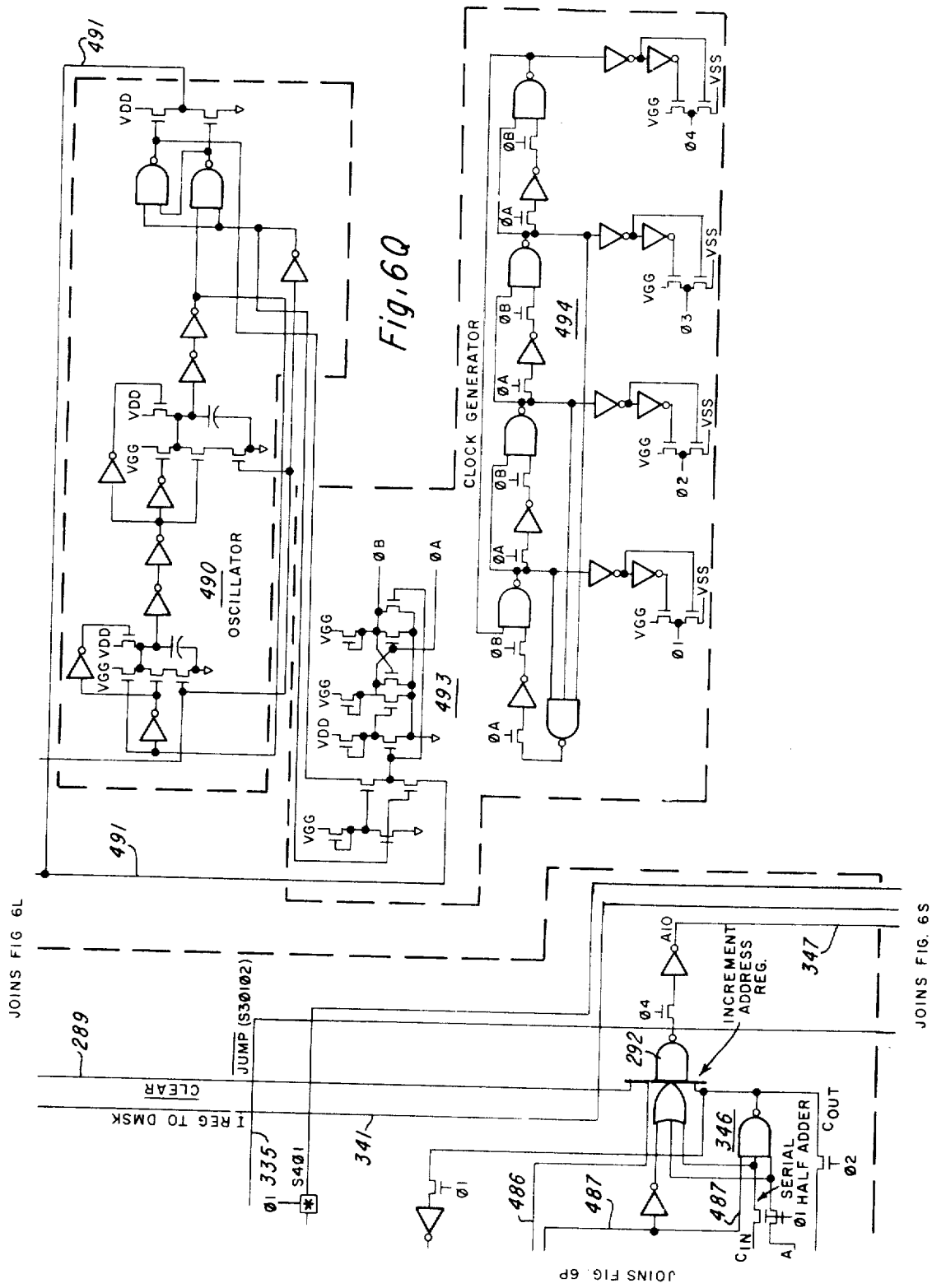

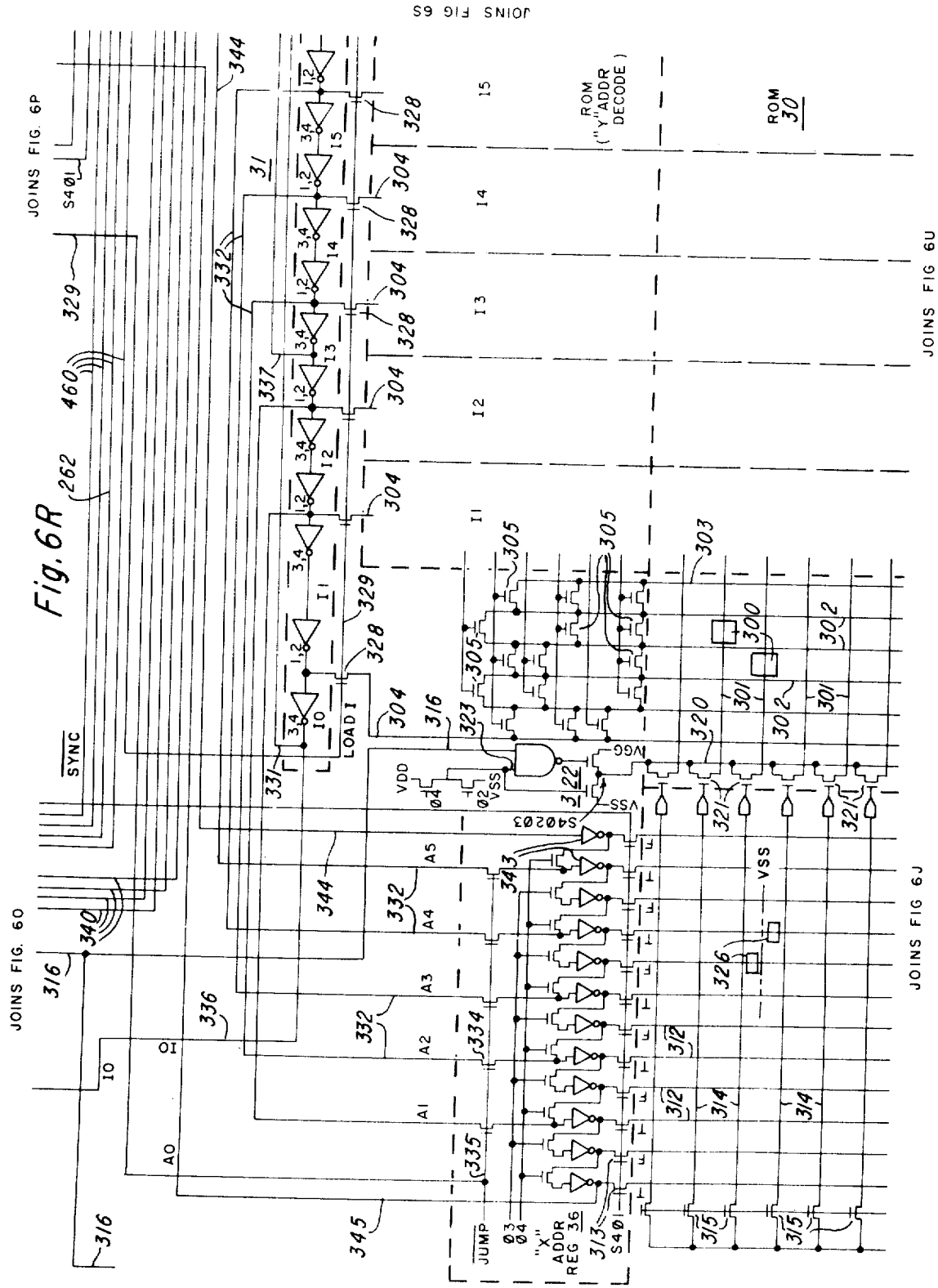

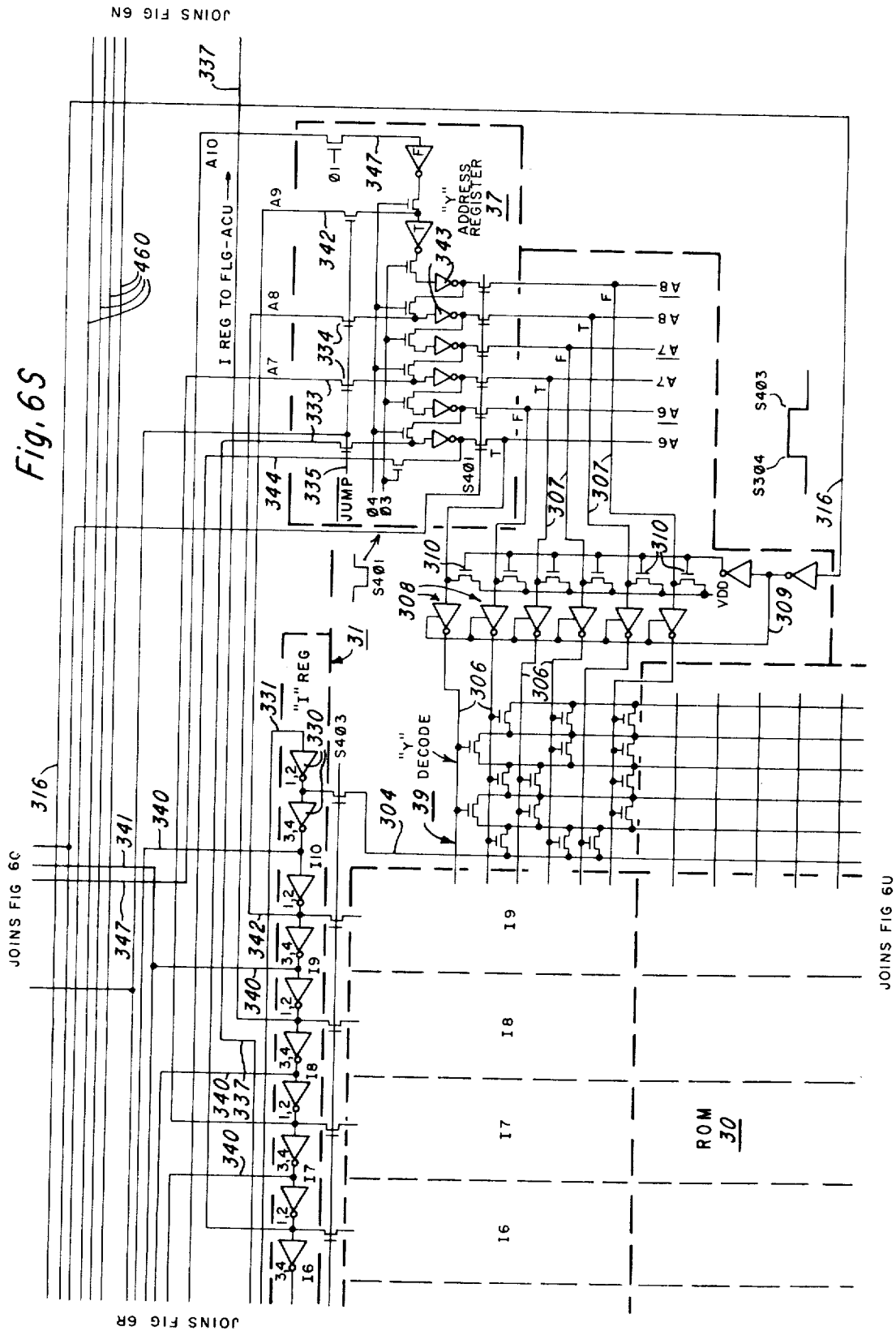

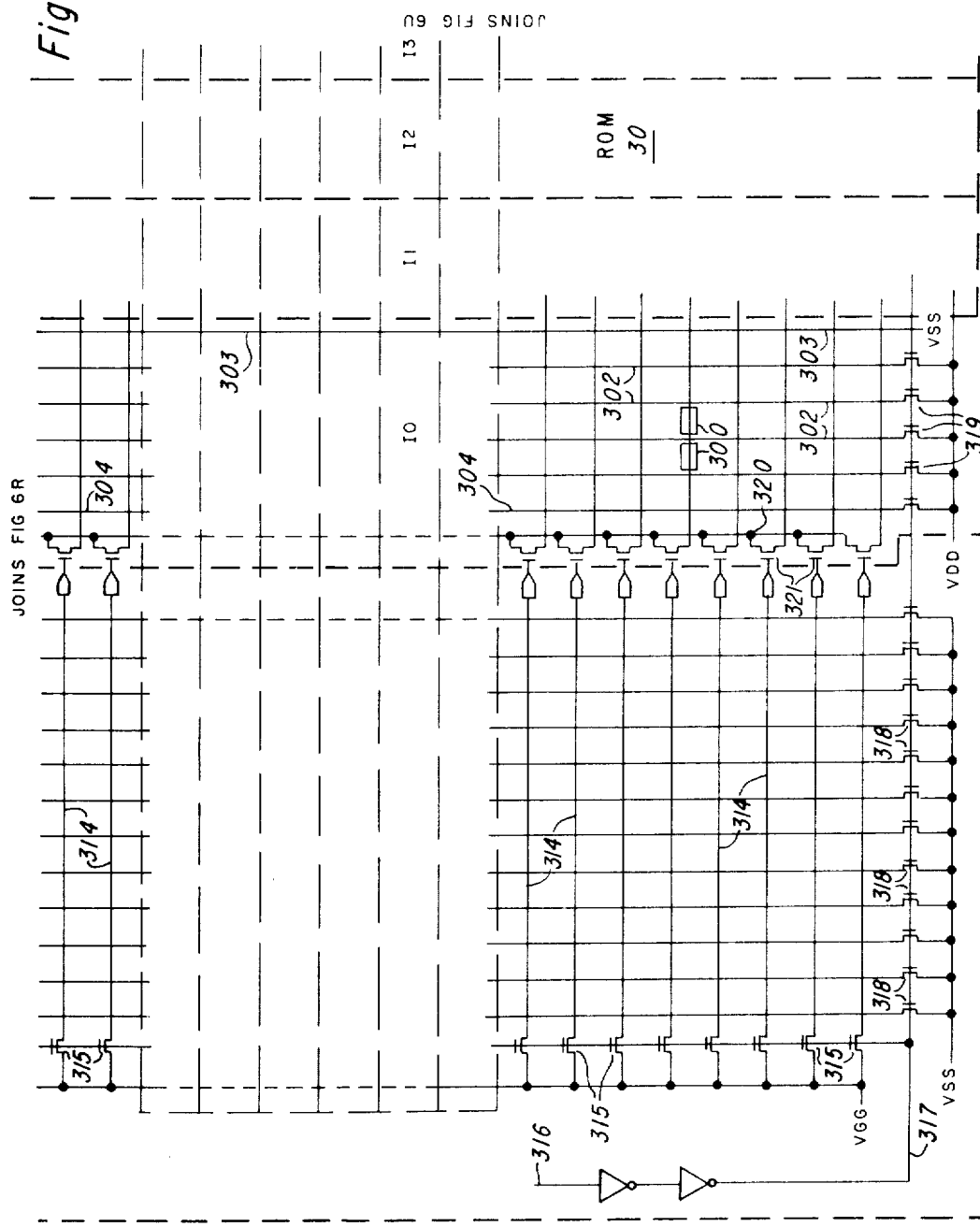

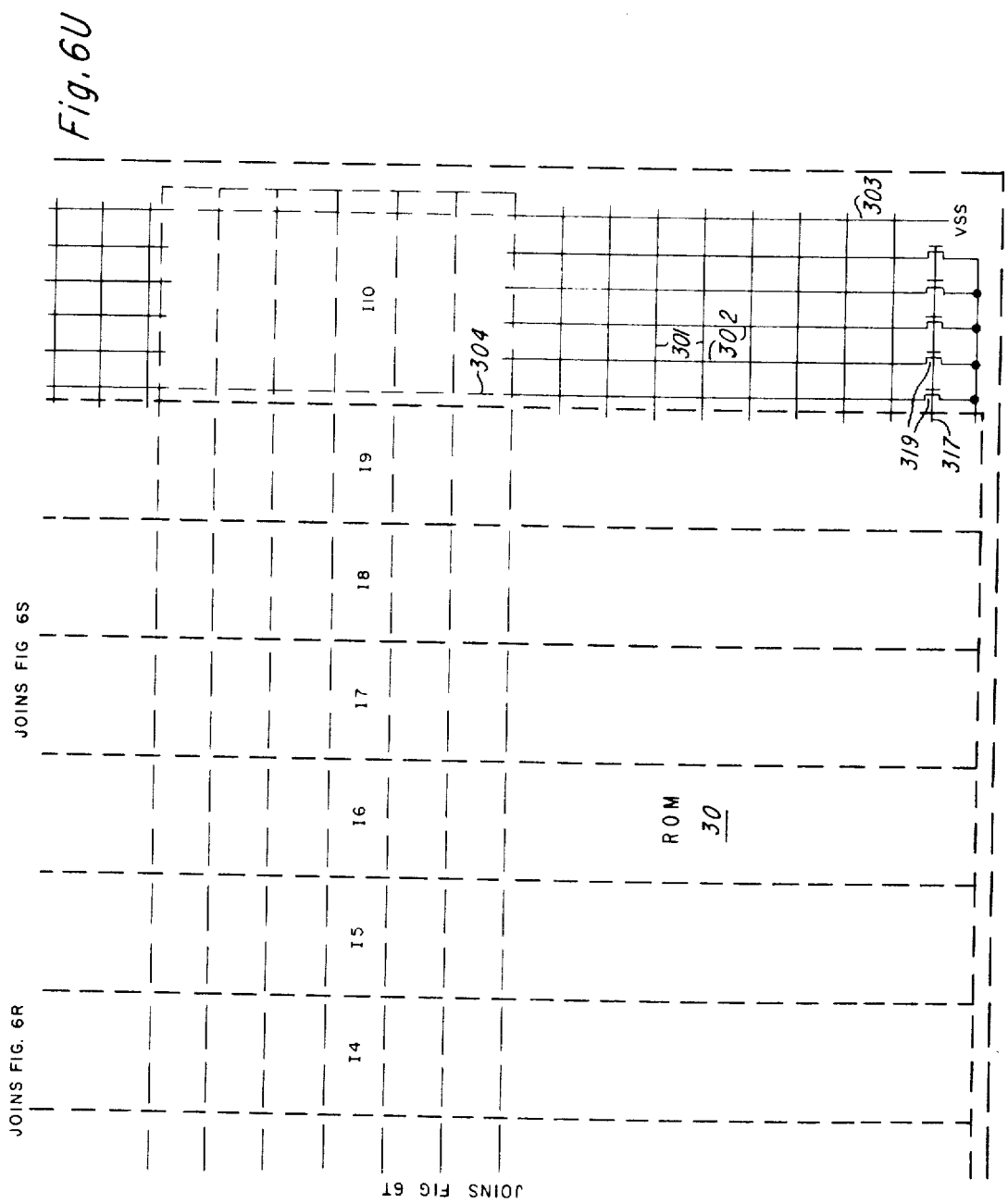

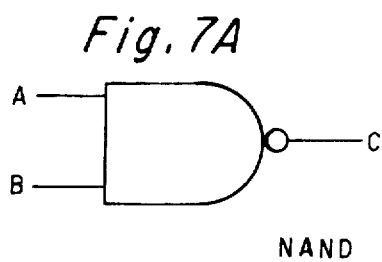
*Fig. 7A*
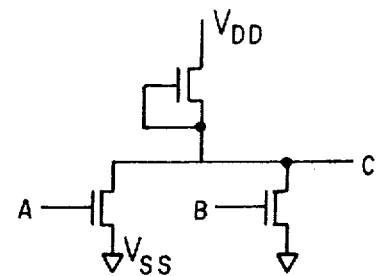
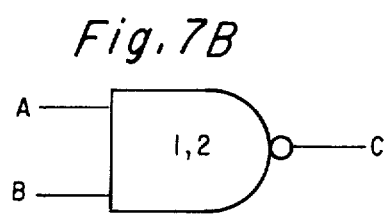
*Fig. 7B*
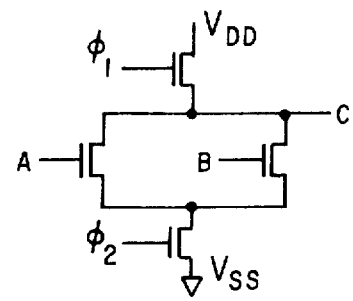
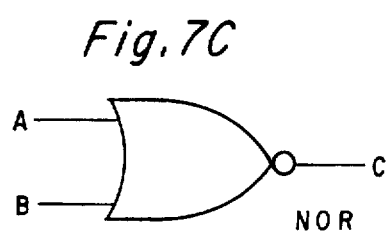
*Fig. 7C*
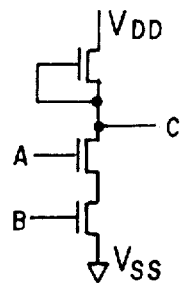
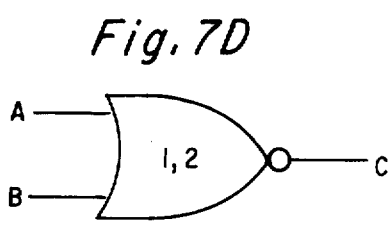
*Fig. 7D*
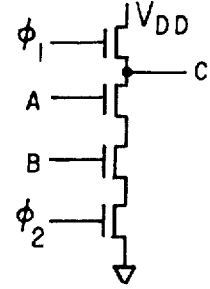
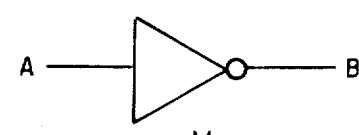
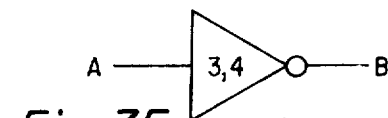
*Fig. 7E*
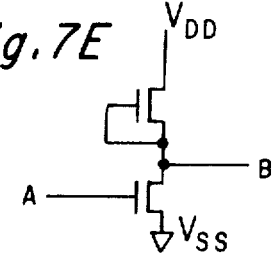
*Fig. 7F*
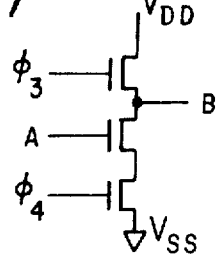

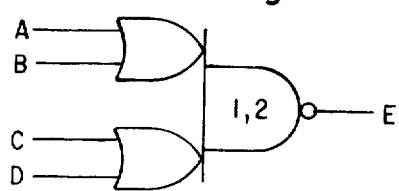
*Fig. 7G*
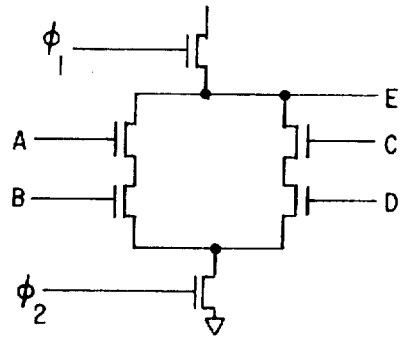
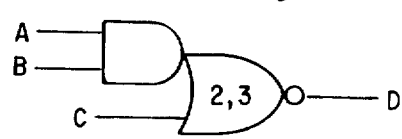
*Fig. 7H*
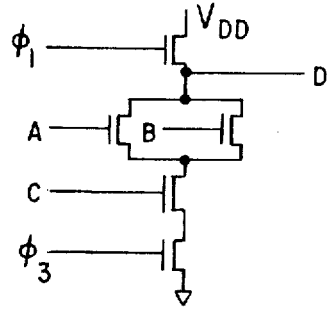
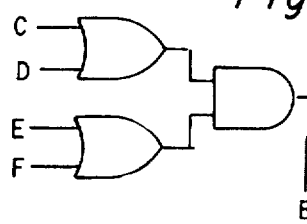
*Fig. 7I*
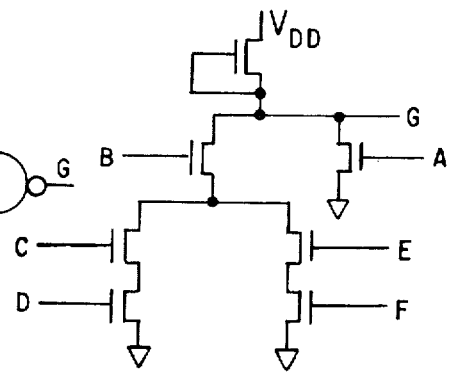
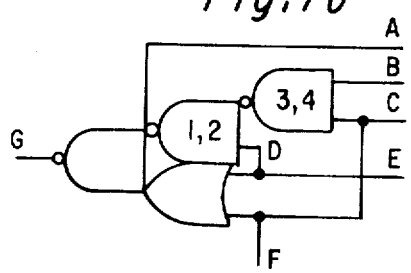
*Fig. 7J*
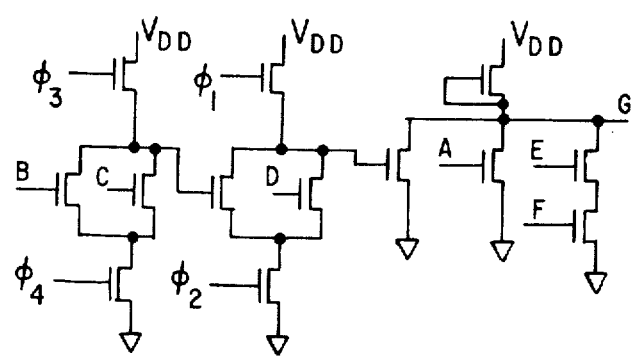

Fig. 9

MASKS

| MASK NUMBER | NAME | S10 | S9 | S8 | S7 | S6 | S5 | S4 | S3 | S2 | S1 | S0 |
|---|---|---|---|---|---|---|---|---|---|---|---|---|
| M0 | F0/DPT7 |  |  |  |  |  |  |  |  |  |  | 7 |
| M1 | F1/EXPD |  |  |  |  |  |  |  |  |  | 4 |  |
| M2 | F2/LSD1 |  |  |  |  |  |  |  |  | 1 |  |  |
| M3 | F3 |  |  |  |  |  |  |  |  |  |  |  |
| M4 | F4 |  |  |  |  |  |  |  |  |  |  |  |
| M5 | F5 |  |  |  |  |  |  |  |  |  |  |  |
| M6 | F6 |  |  |  |  |  |  |  |  |  |  |  |
| M7 | F9 |  |  |  |  |  |  |  |  |  |  |  |
| M8 | F10/ØV1 | 1 |  |  |  |  |  |  |  |  |  |  |
| M9 | ØPFGS |  |  |  |  |  |  |  |  |  |  |  |
| M10 | MSD1 | 1 |  |  |  |  |  |  |  |  |  |  |
| M11 | MANT1 |  | 1 | 1 | 1 | 1 | 1 | 1 | 1 | 1 |  |  |
| M12 | MANT |  | 1 | 1 | 1 | 1 | 1 | 1 | 1 | 1 |  |  |
| M13 | EXP1 |  |  |  |  |  |  |  |  |  | 1 |  |
| M14 | EXP |  |  |  |  |  |  |  |  |  |  |  |
| M15 | ALL |  | 1 | 1 | 1 | 1 | 1 | 1 | 1 | 1 | 1 | 1 |

ELECTRONIC CALCULATOR WITH DISPLAY AND KEYBOARD SCANNING SIGNAL GENERATOR IN DATA MEMORY

RELATED CASES

The subject matter of this application is related to that disclosed and claimed in the following U.S. Patents and U.S. Patent Applications (all filed Sept. 24, 1973):

U.S. Pat. No. 3,921,142 issued Nov. 18, 1975, by John D. Bryant and Glenn A. Hartsell for "Electronic Calculator Chip having Test Input and Output."

U.S. Pat. No. 3,892,957 issued July 1, 1975, by John D. Bryant for "Digit Mask Logic Combined with Sequentially Addressed Memory in Electronic Calculator Chip."

Application Ser. No. 400,472, by Jerry L. Vandierendonck for "Electronic Calculator System Having Serial Transfer of Instruction Word Fields to Decode Arrays."

U.S. Pat. No. 3,932,846 issued Jan. 13, 1976, by Charles W. Brixey, Glenn A. Hartsell and Jerry L. Vandierendonck for "Electronic Calculator Having Internal Means for Turning Off Display."

U.S. Pat. No. 3,934,233 issued Jan. 20, 1976, by Roger Fisher and Gerald D. Rogers for "Read-only-Memory for Electronic Calculator".

BACKGROUND OF THE INVENTION

Electronic calculator systems of the type wherein all of the main electronic functions are integrated in a single large-scale-integrated semiconductor chip, or a small number of chips, are dscribed in the following prior applications which are assigned to the assignee of this invention:

Ser. No. 317,493, filed Dec. 21, 1972 (originally filed Sept. 29, 1967, Ser. No. 671,777) by Jack S. Kilby et al, for "Miniature Electronic Calculator", now U.S. Pat. No. 3,819,921 issued June 25, 1974.

Ser. No. 163,565, filed July 19, 1971, by Gary W. Boone and Michael J. Cochran, for "Variable Function Programmed Calculator", now abandoned, continuation filed Dec. 3, 1973 as Ser. No. 420,999.

Ser. No. 255,856, filed May 22, 1972, by Michael J. Cochran and Jerry L. Vandierendonck, for "Electronic Calculator Implemented in Semiconductor LSI Chips with Scanned Keyboard and Display" now abandoned, continuation filed Feb. 20, 1974 as Ser. No. 444,226.

The concepts of these prior applications have made possible vast reductions in cost of small personal sized calculators. Continuing efforts to reduce the cost of these products include reducing the power drain so that the battery requirements are minimized and incorporating more of the external circuits into the semiconductor chip, as well as making the chip more versatile for performing different functions with a minimum change in the manufacturing steps. The purpose of the system of this application is generally related to lowering the power used by a calculator chip, simplifying the system to save space on the chip to facilitate manufacture, simplify programming, incorporate more of the functions such as clock generators and segment drivers into the chip, and/or provide improved functions from a user's standpoint.

BRIEF DESCRIPTION OF THE DRAWINGS

The novel features believed characteristic of the invention are set forth in the appended claims. The invention itself, however, as well as further objects and advantages thereof, will be best understood by reference to the following detailed description of an illustrative embodiment, when read in conjunction with the accompanying drawings, wherein:

FIGS. 3A–3C are timing diagrams showing voltage vs. time graphs for timing signals used in various parts of the system of the invention;

FIG. 9 is a table of digit and flag masks which may be used in one embodiment of the invention;

INTRODUCTION

Figure 1:
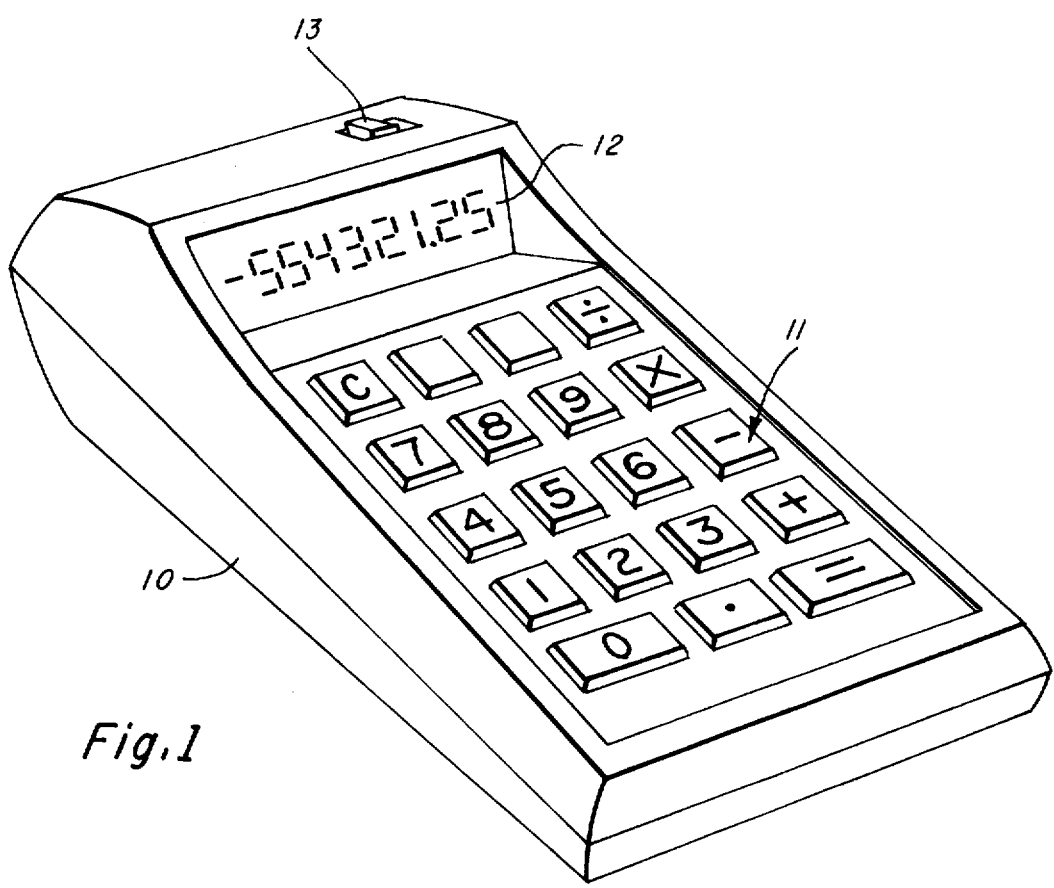
FIG. 1 is a pictorial view of a portable, battery-operated electronic calculator which may employ features of the invention.

The calculator system of the invention is designed primarily for use in a hand-held, battery-powered, pocketsized electronic calculator generally as seen in FIG. 1. The calculator is contained within a small housing 10 of molded plastic or the like, and includes a keyboard 11 of the ten-key type having ten decimal number keys 0 to 9 along with a decimal point key and several function keys such as plus (+), minus (−), equal (=), multiply (×), divide (÷), clear (C), etc. A display 12 is provided, usuallly in the form of a segmented light emitting diode (LED), gas discharge panel, or fluorescent type display. Eight digits plus a ninth "annotator" digit for minus sign, error or overflow indication are shown, this being typical for personal calculators. Each digit includes seven segments plus a decimal point in a typical design; usually the calculator would operate in floating point mode so the decimal point could be in any of the eight digit positions. An off-on switch 13 would be conveniently located on the top face or side of the housing.

The design of the electronic system of the invention is primarily for the purpose of minimizing power drain so that long battery life is provided and a minimum of batteries are needed. Ideally, non-rechargeable throwaway batteries are used; this saves on initial cost of the batteries and saves the cost of the battery charge circuit or AC/DC implementation which would include cord, plug, transformer, rectifier, switch, etc. Of course, the electronic system or MOS chip to be described may be used in desk top, AC powered calculators, even though the design objective is for personal calculators with throw-away batteries. A large part of the power drain in a calculator of this type is in the display 12; little can be done to reduce the basic power drain inherent in the LED's or other display elements, at least within the scope of this invention. However, various features as will be described assure that the display is turned on a minimum of time and the display drive circuitry is optimized. The main way of minimizing power according to the invention is in the design of the main electronic system as implemented in a single MOS/LSI chip.

SYSTEM BLOCK DIAGRAM

Figure 2:
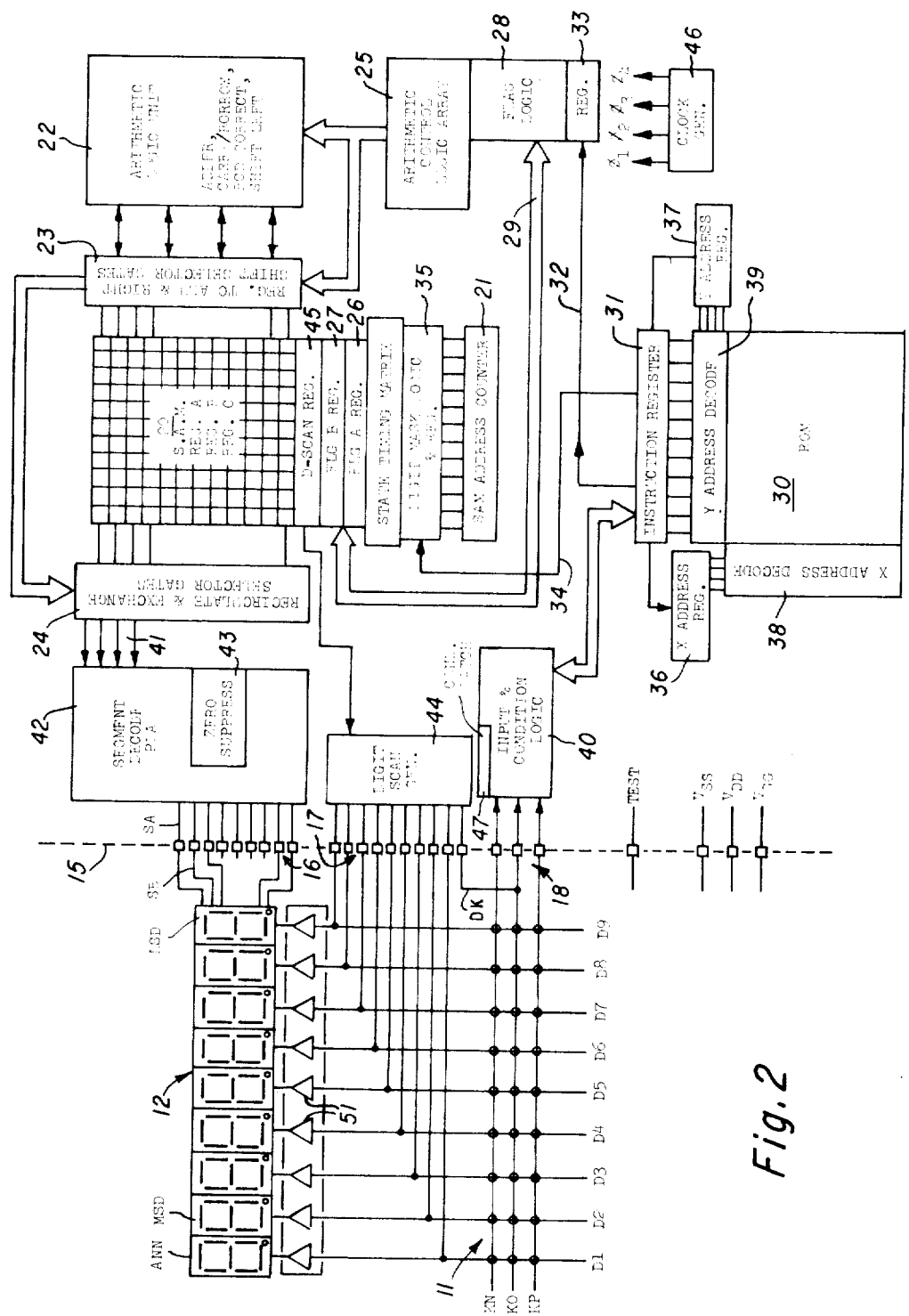
FIG. 2 is a simplified block diagram of the calculator system of the invention.

The major components of the calculator system of the invention are shown in block diagram form in FIG. 2. All of the system components to the right of dotted line 15 are within a single MOS/LSI chip which contains perhaps 5,000 transistors, mounted in a standard 28 pin package. An important factor in system design is minimizing the pin count for the package, and the present design allows several extra pins compared to prior chips. The main input/output pins at the interface 15 are 8 display outputs 16, labeled SA et seq., nine keyboard/display strobe or scan outputs 17, labeled D1 to D9, and three keyboard inputs 18, labeled KN, KO and KP. The display outputs 16 are applied directly (without segment drivers) to the segments of the display 12. All similar segments in the various digits are connected together, and all decimal points are connected together, in the usual manner. The digits of the display are actuated one at a time by a scanning arrangement using the outputs 17, and these scan signals D1 to D9 are also used to poll the keyboard which is in the form of a matrix of key switches. All of the number keys 1 to 9 are on a single one of the input lines 18 called the KN line, the number key O is on the KO line, and the operation keys are on KO and KP lines. So, all of the keyboard information comes in encoded on three lines 18, correlated internally with the "D-times" or keyboard/display strobes D1 to D9 on lines 17.

The calculator chip includes three working registers, called registers A, B and C, located within a sequentially addressed memory 20 which is referred to as a S.A.M. This device, as described in copending application, Ser. No. 163,683, filed July 19, 1971, is a random access memory array which is addressed in sequence by a state counter 21. The state counter is a ring counter which generates "state times" or "S times" used to address the rows of cells in the memory array and also for other purposes. Various calculations are made by processing the numerical data in the registers through an arithmetic logic unit 22, which basically consists oof a bit-parallel serial-digit binary adder, a carry/borrow circuit, and a binary-coded-decimal (BCD) corrector. The latter is needed because numbers are stored in the SAM 20 in BCD, yet the adder works in binary, so the output of the adder must be corrected before re-entering a result into the registers of the SAM 20. Selector gates 23 on the right-hand side of the SAM 20 control which registers of the SAM are fed into the ALU 22 and what register the result is entered into. Also, the selector gates 23 provide a right-shift function for any register if desired. Left shift may be implemented by a shift left circuit in the ALU 22. Selector gates 24 on the left side of the SAM 20 provide for recirculation of the data in the registers or exchange of data from one register to another. All of these selector gates and the parts of the ALU 22 are under control of the outputs from arithmetic control programmable logic array 25.

In addition to the working or data registers A, B and C, the SAM contains two eleven bit flag rigisters 26 and 27, or Flag A and Flag B. These are used for temporary storage of status information during the program. The bits in the flag registers may be set, zeroed, exchanged, recirculated, etc., under control of flag logic array 28 which is connected to the SAM via lines 29.

The program for operating the calculator is stored in a read-only memory or ROM 30 which contains 3,520 bits of storage, arranged in 320 words with 11 bits per word. One word at a time is read out of the ROM into an instruction register 31, and the 11 bit word existing in this register defines what happens in the calculator during a given instruction cycle. A part of the instruction word is applied serially from register 31 via line 32 to a register 33 which is connected to both the arithmetic control array 25 and the flag logic array 28 in common. Another part of the instruction word is applied via line 34 to a register within a digit mask logic array 35 in the SAM 20, as will be explained. The particular instruction word read out of the ROM at a given time is defined by X and Y address registers 36 and 37. The X and Y registers 36 and 37 control X and Y address decoders 38 and 39. The ROM is partitioned into eleven segments so that for a given six bit X address and three bit Y address, eleven bits are addressed and read out from the ROM into the instruction register 31. The word in the instruction register 31 defines the current operation of the system and, along with input and condition logic 40, produces the next address for the ROM. The address registers 36 and 37 may be incremented, one location at a time, or may jump or branch to a specified location (loaded from the instruction register 31) under control of input and condition logic 40. This logic unit 40 receives the keyboard inputs 18 and generally initiates control or operation of the various parts of the system and provides for data input, along with the program in the ROM. In general terms, operation of the system is totally defined by generating a ROM address by the logic arrangement 40 in conjunction with the instruction register 31, in response to a particular key in the keyboard 11 having been pressed, then jumping to that address in the ROM and reading out the instruction word into the register 31 and implementing it. Then, the X and Y address registers are incremented to the next address or perhaps caused to branch to a remote address until the function represented by that key has been completed, which may take several or a dozen instruction words, then the system goes back into a wait mode until another key is punched. In the wait mode, the system is cycling through instruction words which in effect scan the keyboard and at the same time cause the number entered or the result to be shown on the display 12.

The A register in the SAM 20 is always the source of data displayed in the display 12. A number being entered is always displayed, so it is entered in the A register; a result from a calculation is displayed, so it goes into the A register upon completion of a calculation. So, output from the SAM 20 to the display 12 is from the A register and is coupled via lines 41 through a segment decoder and output PLA 42 which functions to change a BCD number, one digit at a time, to a selected combination of segments on the lines 16 going to decimal digit display 12. This is accomplished generally by means of a programmable logic array. Zero suppression means 43 is included in the output PLA.

The "D-times" used for keyboard/display strobe via the lines 17 are generated in a digit scan register 44 which operates in conjunction with a D-scan register 45 that is part of the SAM 20. The display 12 is strobed most significant digit or MSD first to allow leading zero suppression, whereas the registers in the SAM are sequentially addressed beginning with least significant digit or LSD because the adder or ALU 22 must operate digit-by-digit starting with LSD. So, the digit scan arrangement must count in one direction while the state counter 21 is counting in the other direction.

SYSTEM TIMING

The basic timing element of the system is the clock input $\phi$ as seen in FIG. 3A. This clock is at a rate of about 100 to 160 KHz. A clock generator 46 within the chip (see FIG. 2) generates four clocks $\phi1$, $\phi2$, $\phi3$, $\phi4$ as illustrated in FIG. 3A. A set of four clocks represents one state time or S time, so state times are at a 25 to 40 KHz rate or 24 to 40 microseconds in length. The state times are generated from the clocks $\phi1$ to $\phi4$ in the SAM address counter 21. There are 11 state times $S_0$ to $S_{10}$ as seen in FIG. 3B, corresponding to the 11 digits per data word in the SAM registers, one state time for each digit. A full set of 11 state times represents one "digit time" or D time, and also corresponds to one instruction cycle. So, an instruction cycle is about 264 to 400 microseconds long, or instruction cycles occurring at a rate of roughly 2 to 4 KHz. D times are used for keyboard and display scan, and there are nine digits in the display; FIG. 3C illustrates the sequence of D times used for strobing the display and keyboard. Note that there is one dead time, D10. A complete scan of the display and keyboard referred to as a "scan time" occurs once every ten D times or instruction cycles, i.e., once every 2640 to 4000 microseconds or 2.6 to 4 milliseconds. That is, the display or keyboard is completely scanned about 200 to 400 times a second. A person operating the calculator would manually depress a key for at least a few tenths of a second or more, so it is seen that at least about 50 or more complete scans would occur during the time a key is down. This would represent more than 500 instruction cycles, so almost any calculation or operation within the calculator would be completed faster than a person could punch the keys. Considering the display 12, a given digit such as the righthand digit which is LSD will be turned on or lit up only during D9 or once every scan time, i.e., for say 300 microseconds every 3000 microseconds, a duty cycle of one-tenth. It will blink on and off 200 to 400 times a second, which is far above the rate which the eye can perceive, so the display seems to be steady rather than being scanned in sequence.

In FIG. 3C, it is seen that the digit times progress from MSD to LSD, going from D1 to D9 as seen in FIG. 2. The data in one digit of the A register in the SAM 20 is brought out through the segment decoder 42 for display during each D time. FIG. 3C shows that the information at S10 of register A comes out during D1, S9 during D2 and proceeding on to S2 at D9. S10 is the annotator; that is, the minus sign, low-battery indicator, etc. S9 is the MSD and S2 the LSD. S1 is dead or blanked; only eight numerical digits are displayed. The SAM contains eleven digits per register in locations S10 to S0. Thus, since the scan repeats every 10 instruction cycles, but there are 11 locations, S0 is never brought out. And the scan sequence precesses or counts backwards, S10 to S1 or MSD to LSD, while the SAM is addressed S0 to S10, or in a direction of LSD to MSD. This arrangement readily permits leading zero suppression in the segment decoder 42. It is desirable that the display show no zeros to the left of the first non-zero digit or the decimal point. Thus, if the number 6.25 is entered, the display shows 6.25 and not 000006.25. The zero suppress circuit 43 functions to blank the display in this example for the first five digits coming out since these are zeros, then unblank when the "six" is detected which is the first non-zero digit it sees.

Ordinarily, (depending upon programming) the information in the S0 position in each of the A, B and C registers in the SAM 20 is the decimal point or DPT position, the S1 position contains an exponent, S2 to S9 is the mantissa with S10 for overflow. So, when the number 6.25 is entered by the keyboard, the A register will contain 00000625 as a mantissa in positions S9 to S2, and a 2 in S0 meaning that the decimal point is two places to the left. As seen in FIG. 3C, there is no S0 brought out for display, nor S1. The exponent at S1 is used internally, and the DPT is accounted for, as will be explained.

THE DISPLAY

Figure 4A:
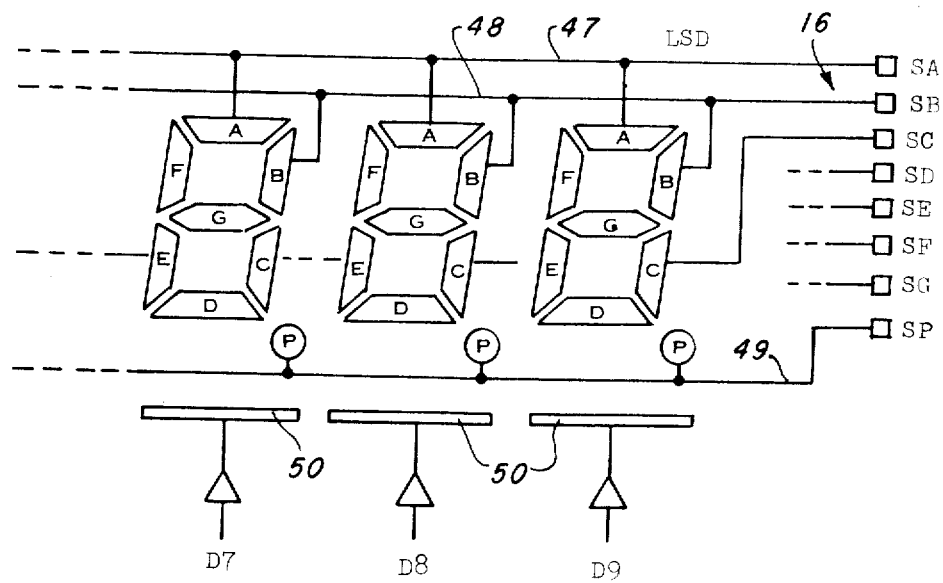
FIGS. 4A–4B are diagrams and tables of the display output format.

Referring to FIG. 4A, the display 12 is shown in more detail. Three of the nine digits are shown. Each digit is made up of seven segments A to G plus a decimal point P. The outputs 16 from the chip are labeled SA to SP corresponding to the segments in the display. All of the A segments are connected together by a line 47, all B's are connected together by a line 48, etc., and all decimal points P are connected together by a line 49. The segments represent cathodes in a LED unit, or in a gas discharge panel. The D-scan outputs D1 to D9 are separately connected to anodes 50 which represent transparent metal film covering the cathodes in a gas discharge panel display or anodes common to all cathode segments in a digit for LED displays. Digit drivers 51 couple the D lines 17 to the anodes 50; these are merely amplifiers to provide the proper voltage levels for actuating the display elements. All of the drivers 51 may be contained in a pair of bipolar integrated circuits.

Figure 4B:
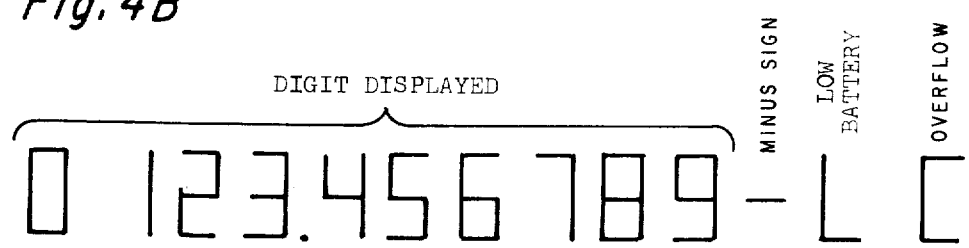

In FIG. 4B, one code for actuating the display of FIG. 4A is shown. For example, to show a zero, all segments except SG are actuated. To show a one, segments SA and SB are actuated. The code of FIG. 4B is programmed into the segment decoder output PLA 42; this PLA is gate programmable so that different codes could be used for different types of displays. In a preferred embodiment, overflow is indicated by blinking the entire display, instead of the symbols shown.

THE INSTRUCTION SET

Figure 5:
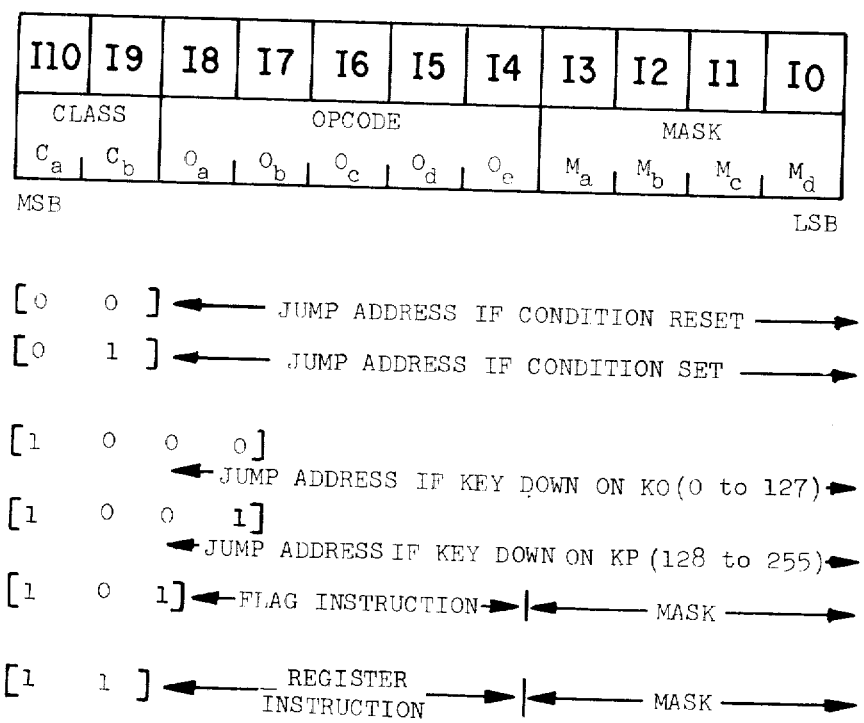
FIG. 5 is a representation of the makeup of the instruction word used in the system of the invention.

The instruction words stored in the ROM 30 and read into the instruction register 31 are of the format shown in FIG. 5. The 11 bits of the word are labeled I0 to I10. For jump instructions, 9 bits are used for the jump address. For register and flag operations, the word contains three fields, a mask field made up of I0 to I3 called M$a$ to M$d$, an OPCODE field made up of I4 to I8 called O$a$ to O$e$, and a class field made up of I9 and I10 called C$a$ and C$b$. The bits from the mask field are connected from the instruction register 31 via line 34 to a register in the mask logic 35 seen in FIG. 2. The OPCODE field is connected to a register 33 via line 32 from which the flag logic 28 and the arithmetic control logic 25 are both driven. This is an important feature of the system, as it greatly simplifies the layout and programming. The class field is connected to input and condition logic 40 as it is concerned with branch and conditional branch instructions. The input and condition logic 40 contains a condition latch 47 which is esponsive to various operating situtations in the system such as a flag condition or a keyboard input, and a branch is executed if the condition latch is set but not f the latch is not set or at reset. If the class field is 00, .e., I9 and I10 are 00, the instruction word is for a 'jump" if the condition latch has not been set, that is, it reset. If the class field is at 01, a jump is executed if condition is set. For jump instructions, the I0 to I8 bits ire the address of the next instruction word, so these bits are loaded from the instruction register 31 to the address registers 36, 37. If the class field is 11, the instruction is for a register operation, and the OP-CODE and mask fields are used as mentioned above. A class field of 10 indicates either a flag instruction or a 'jump if key down" operation; the first two bits of the OPCODE field determine which type of operation is executed. 1000 causes a jump to the address of I0 to I8 f a key is down on the K0 line. 1001 causes a jump to the I0-I8 address if a key is down on the KP line. 101 results in a flag operation, i.e., the OPCODE field gives a flag instruction which is decoded in the flag logic array 28. In Table I at the end of this specification, a more detailed list of program instructions possible within the constraints of the format of FIG. 5 is given for illustration. Note that the flag logic unit 28 is also referred to as a program logic unit. These instructions will be referred to in more detail later.

DETAILED DESCRIPTION OF SYSTEM LOGIC DIAGRAM

Figure 6:
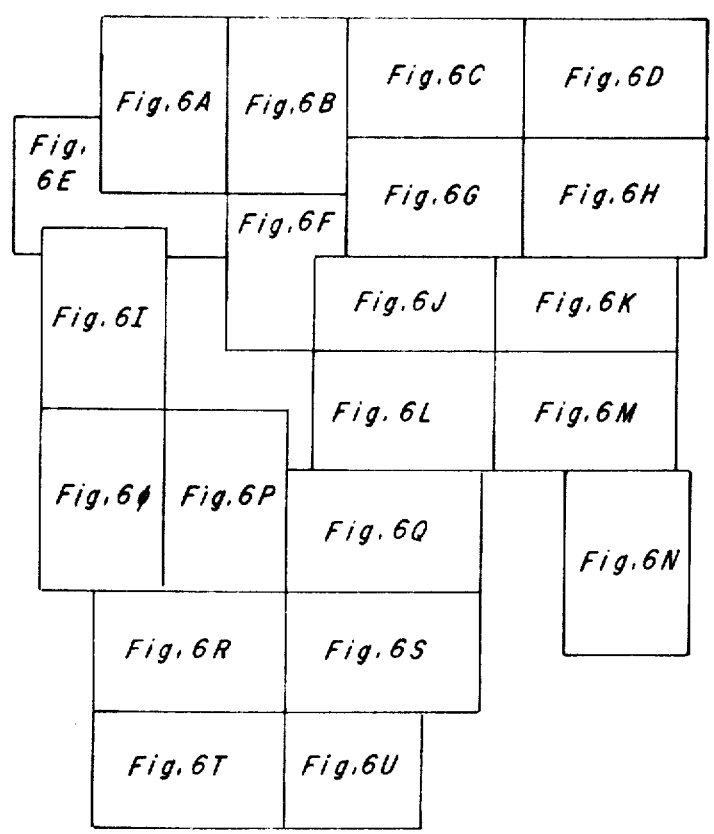
FIG. 6 is a layout map for FIGS. 6A–6U.
Figure 6A:
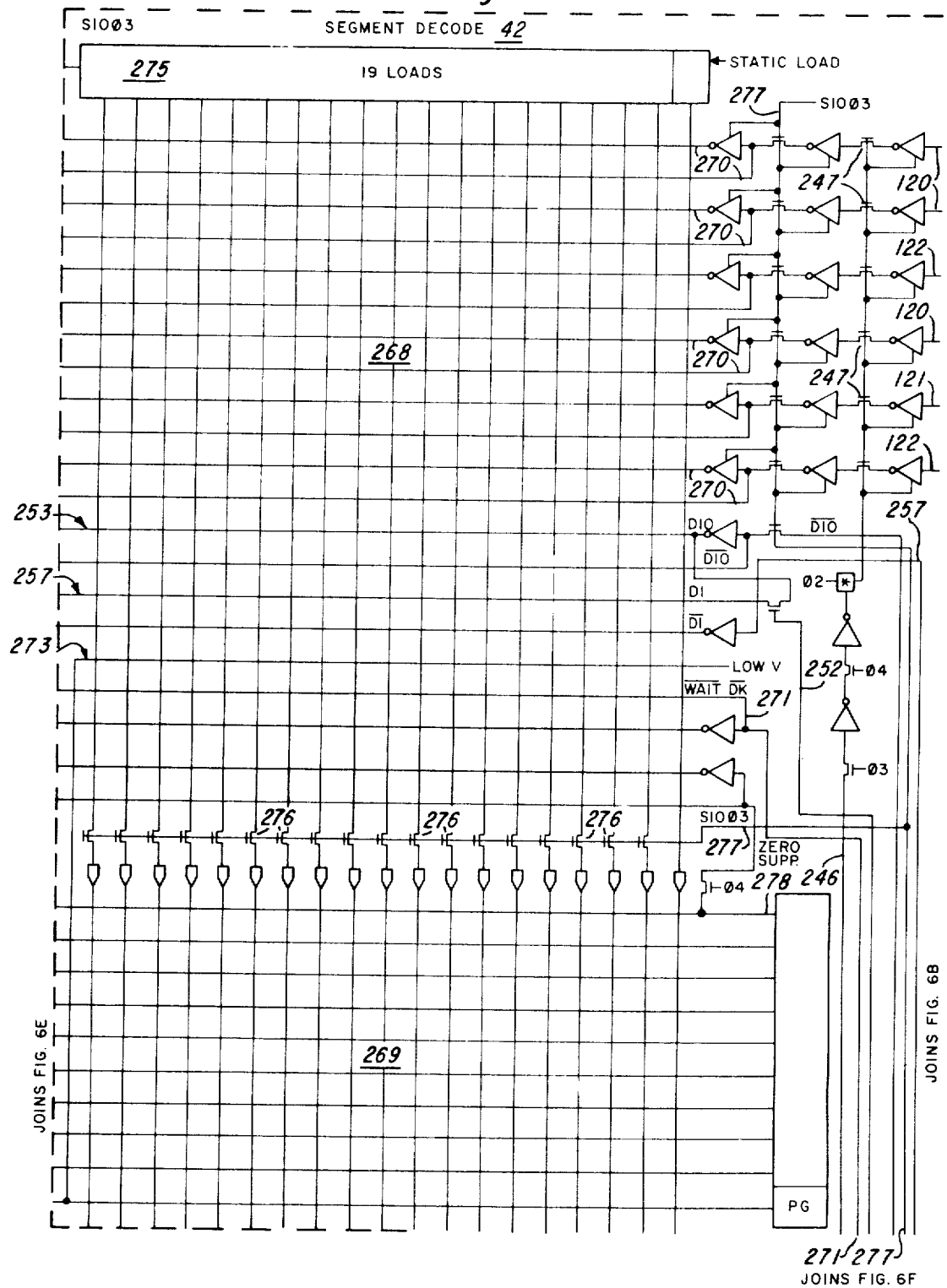
FIGS. 6A–6U are a composite electrical diagram of the circuit of the calculator system of the invention.
Figure 6D:
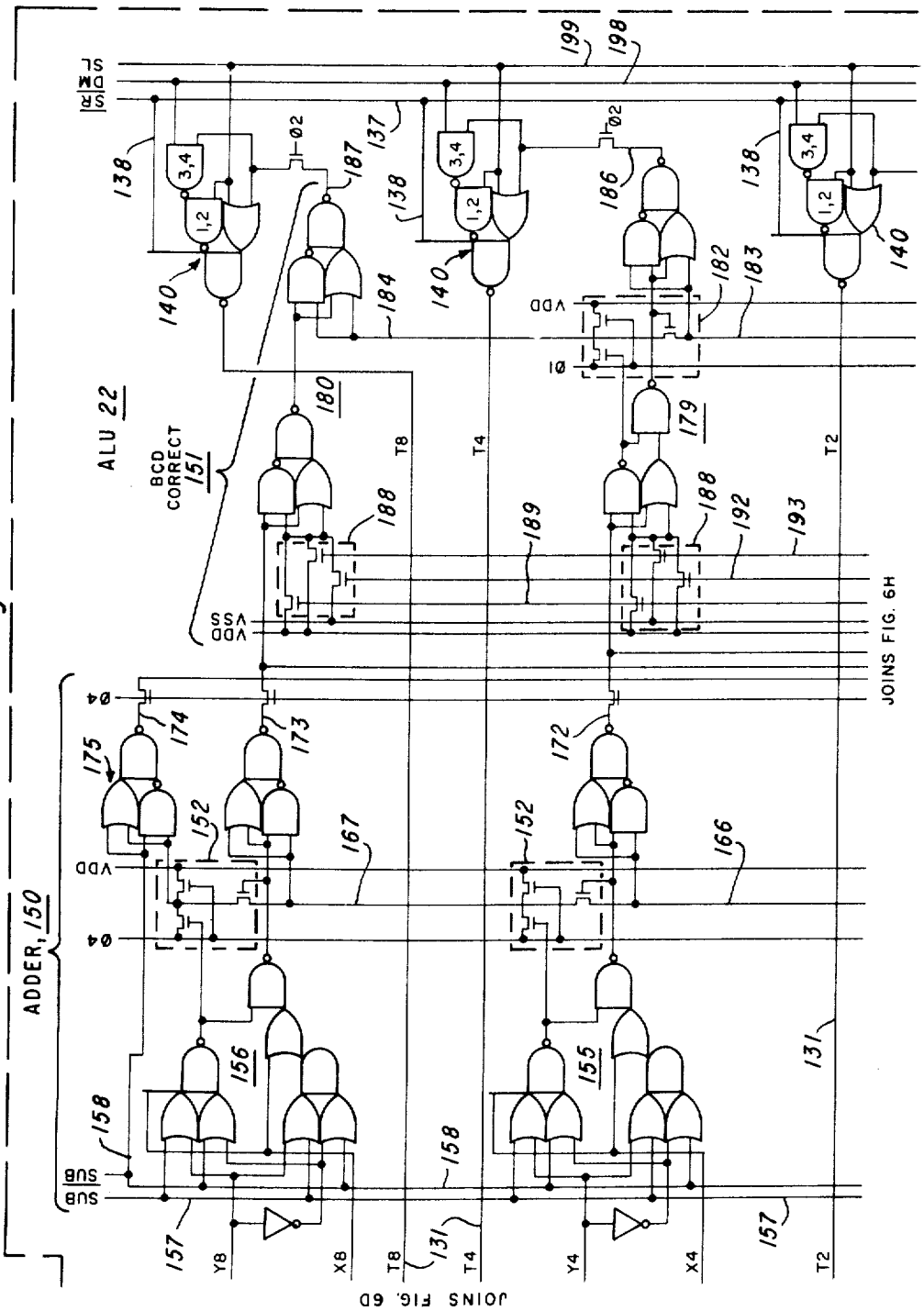
Figure 6G:
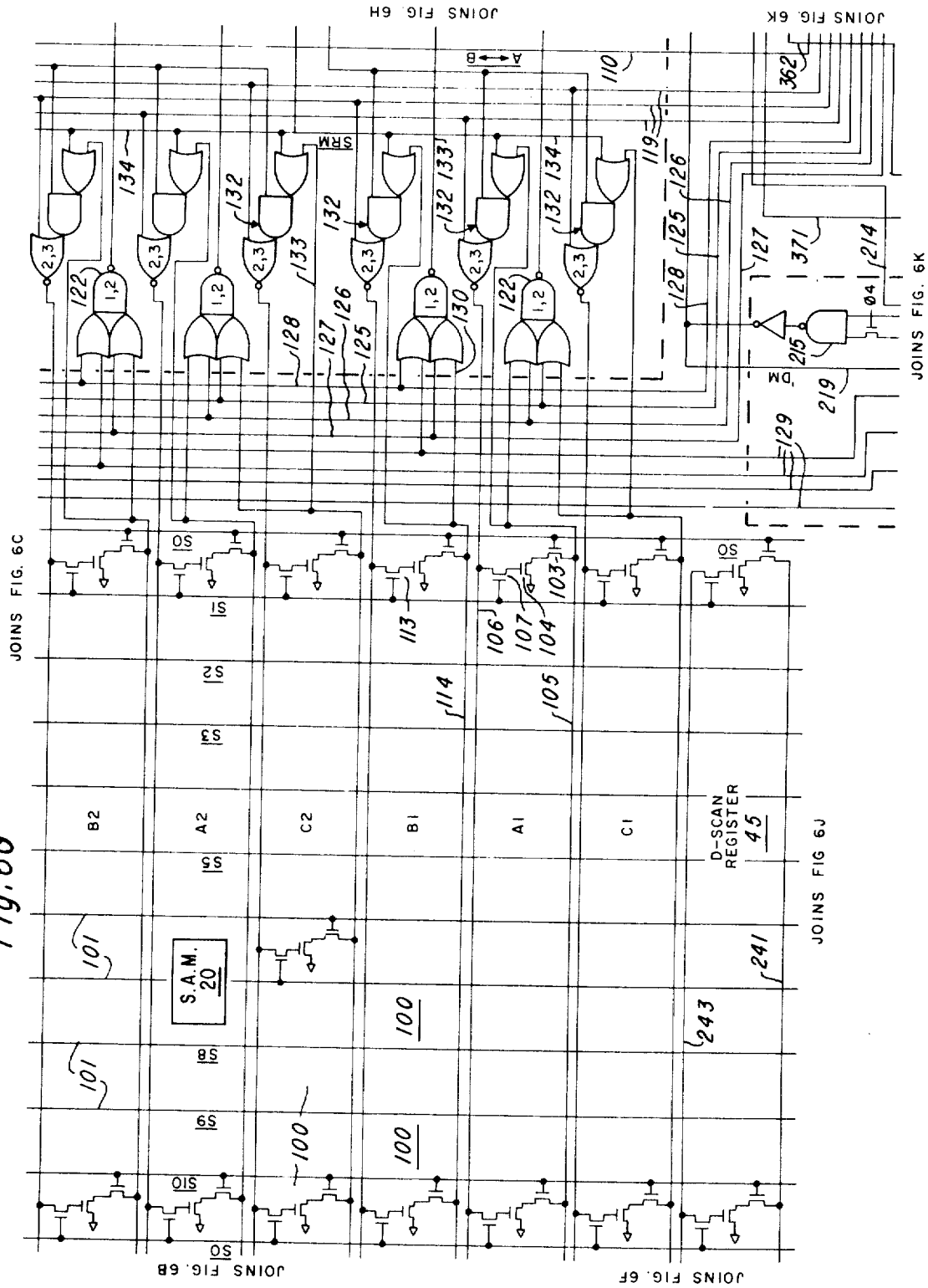
Figure 6J:
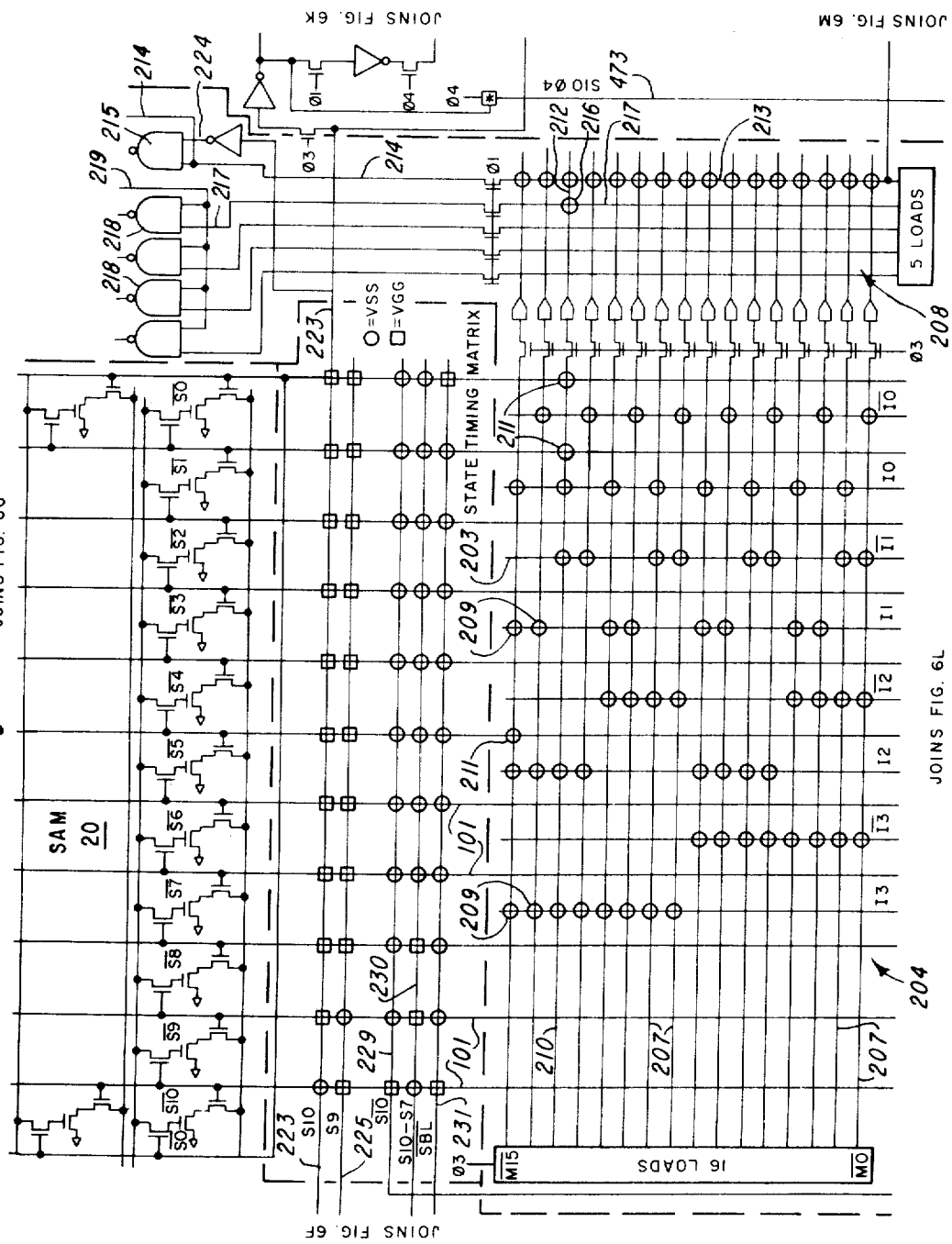
Figure 6K:
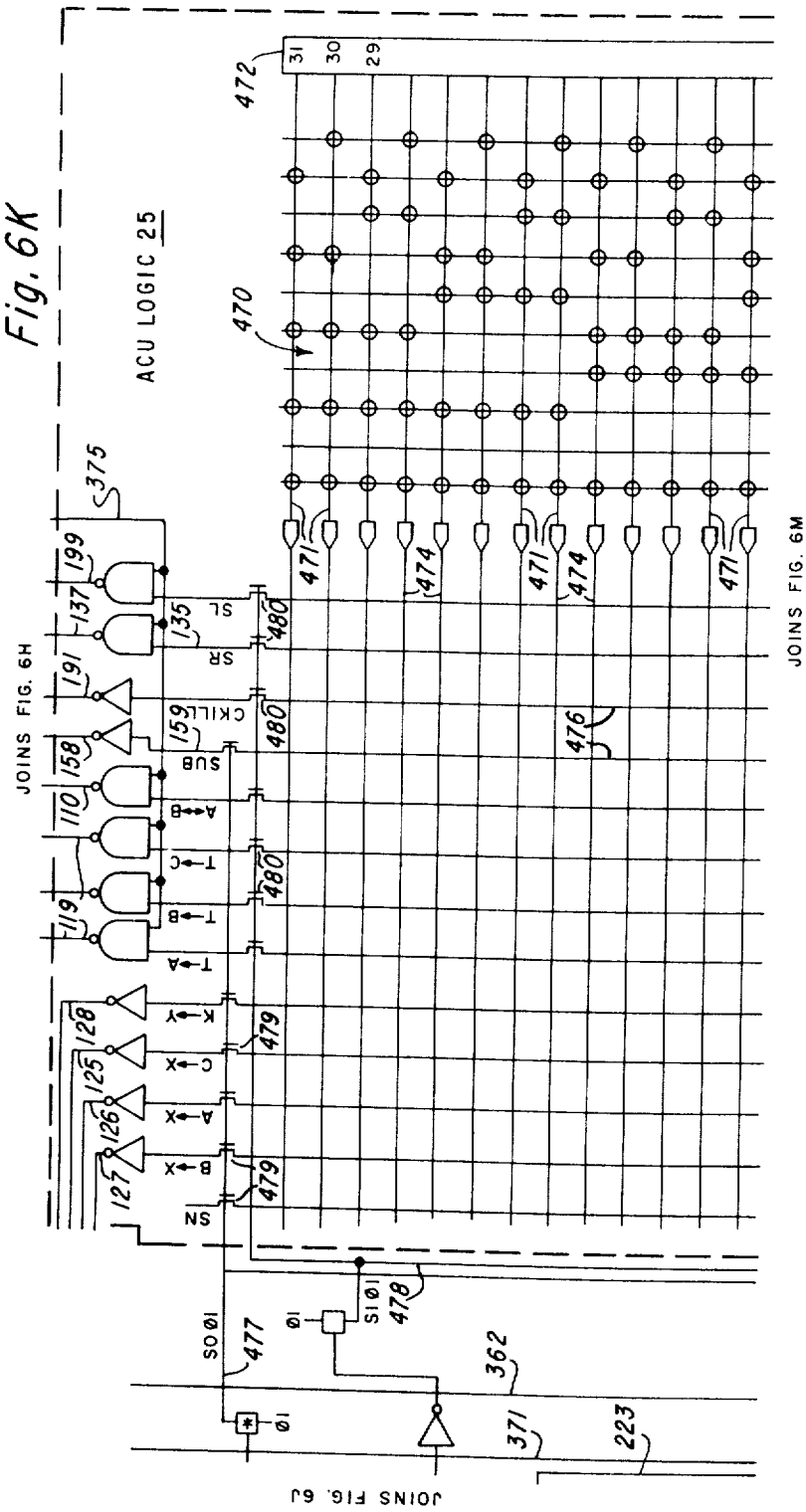
Figure 6P:
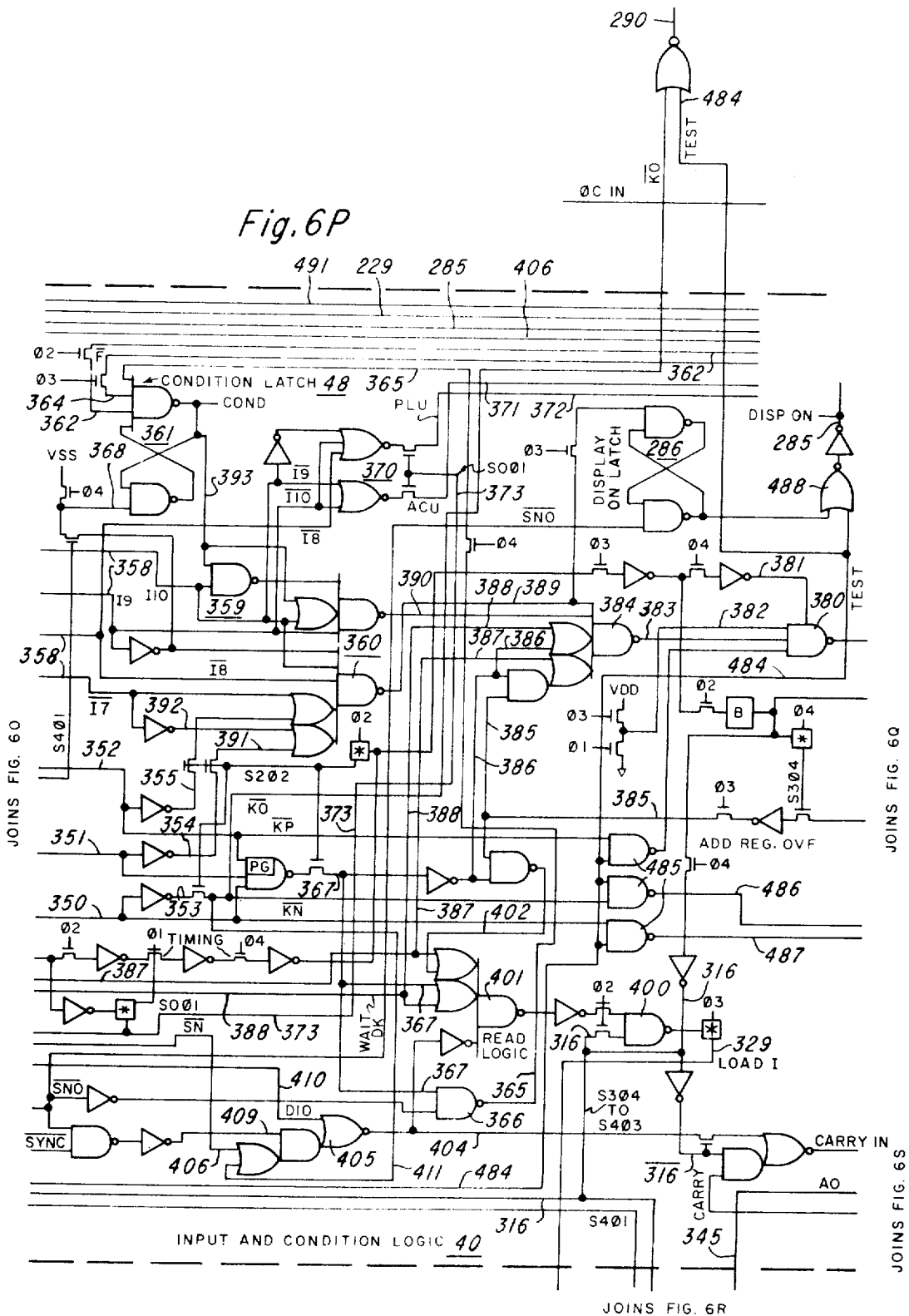
Figure 7K:
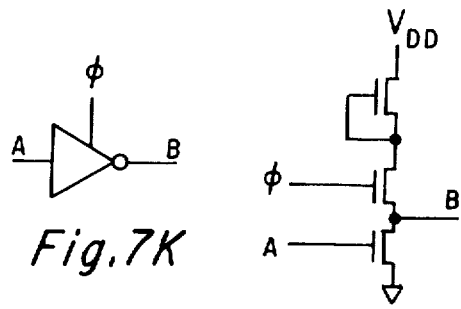
FIGS. 7A–7S are detail electrical diagrams of logic functions used in the diagram of FIGS. 6A–6U.
Figure 7L:
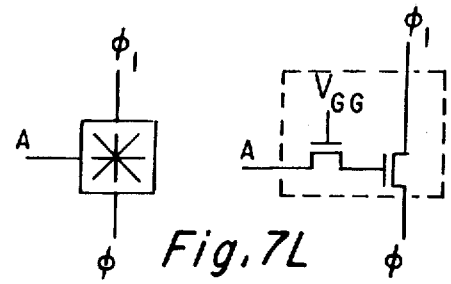
Figure 7M:
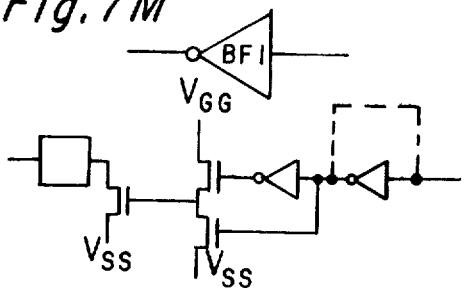
Figure 7N:
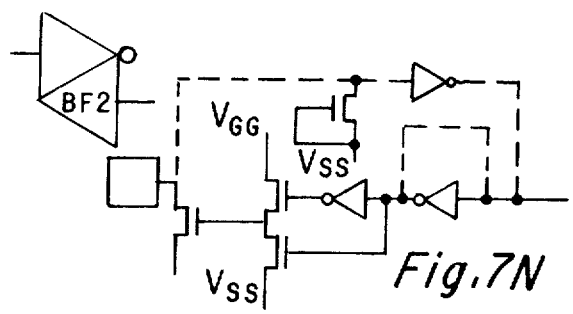
Figure 7O:
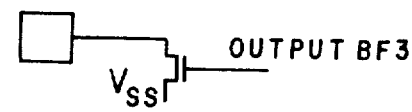
Figure 7P:
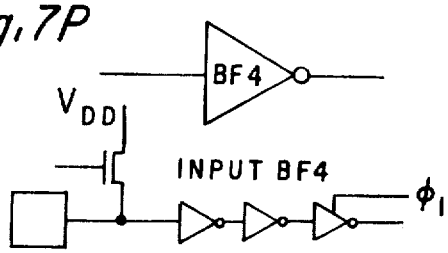
Figure 7Q:
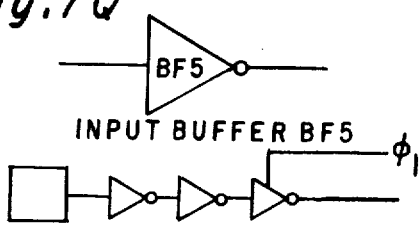
Figure 7R:
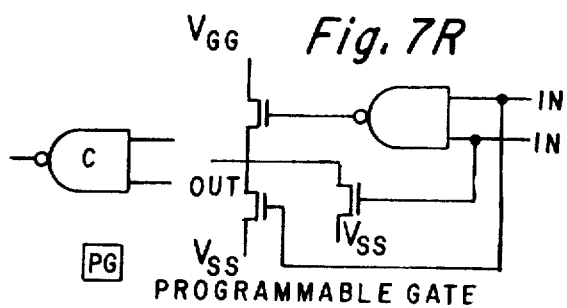
Figure 7S:
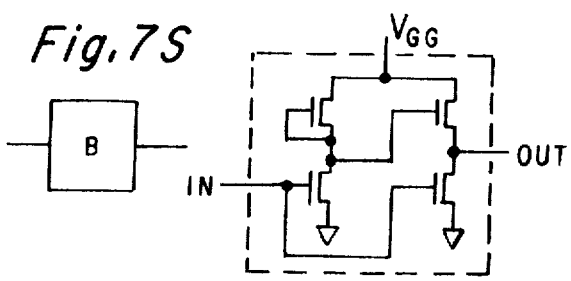
Figure 8:
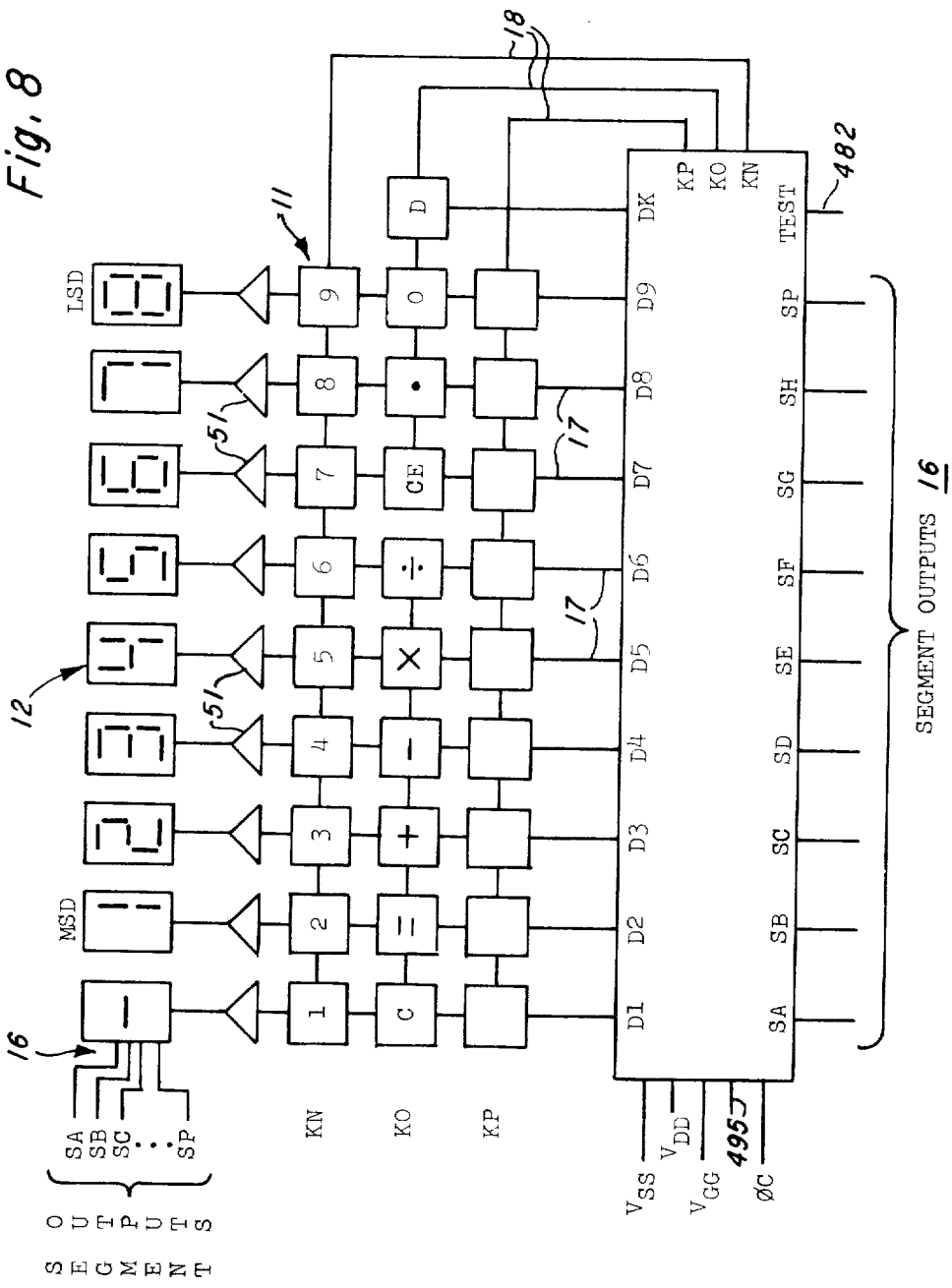
FIG. 8 is a representation of the keyboard input matrix used with the system of FIGS. 2 and 6A–6U.
Figure 10:
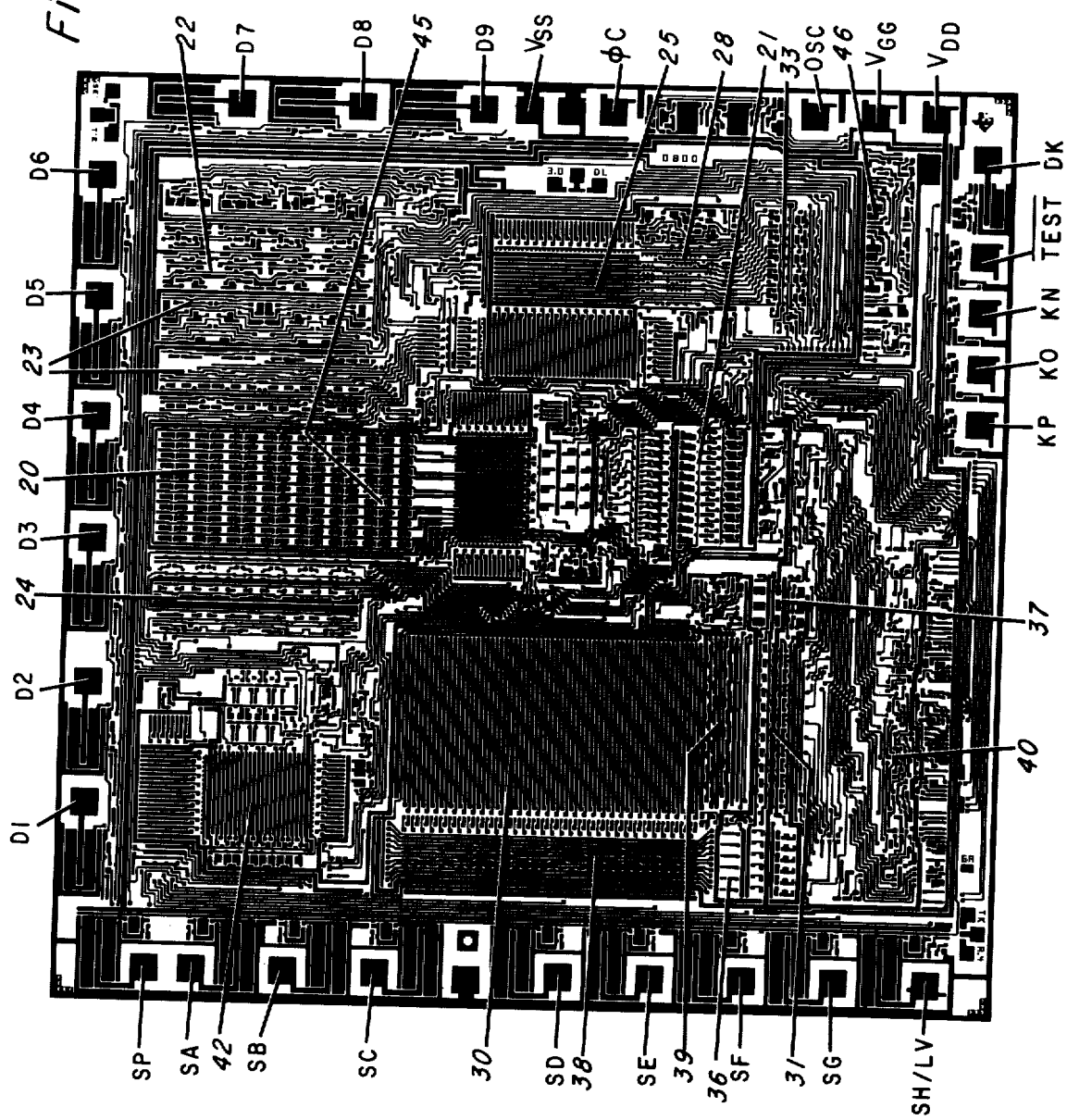
FIG. 10 is an enlarged view of a photomask used for the metallization level in the manufacture of an MOS/-LSI semiconductor chip incorporating the entire electronic system of the invention.

The various parts of the system of FIG. 2 will now be described with reference to FIGS. 6A through 6U which in composite is a complete logic diagram of the calculator chip.

THE S.A.M. AND SELECTOR GATES

The main A, B and C registers of the calculator system are contained within a random access memory arrangement 20 which is operated in a manner similar to a set of shift registers, as set forth in copending application, Ser. No. 163,683 abandoned, continuation filed Apr. 8, 1974 as Ser. No. 458,934. The SAM 20 includes an A register which is comprised of four separate rows A1, A2, A4 and A8, in BCD format. Likewise, the B and C registers each comprise four rows B1, B2, etc.; these are interleaved to save space in interconnecting the registers and the ALU through the selector gates on the chip. Each row includes eleven cells 100, or one for each digit or character, with each cell being a conventional three-transistor MOS RAM memory cell. All of the memory cells 100 in the SAM are exactly the same, and there are a total of 11 × 4 × 4 or 132 cells in the main A, B and C registers. The SAM also includes two flag registers 26 and 27 and a D-scan register 45, each of which are 11 bit rows, or 33 more cells, for a total of 165 cells in the SAM . Vertical lines in the SAM are address lines 101 of which there are 12, these bit address lines being driven by a commutator 21 made up of an eleven stage ring counter which circulates a zero in synch with state times. Indeed, the commutator 21 generates the state times S0–S10 for use throughout the system. Only one of the address lines 101 is energized at any one time (except S0 as will be explained), and the energized line shifts from right to left in the order S0, S1, S2, . . . S10, S0, etc., one at a time, producing the signals seen in FIG. 3B. In the commutator 21, a recirculate signal is coupled back to the beginning stage by a line 102 when the zero propagating through the commutator reaches S10; this indication on line 102 is also used in the power up clear circuit as will be explained.

When an $\overline{S0}$ energizing voltage or 0, a negative voltage, appears on the S0 address line, all of the MOS transistors 103 (looking now at the S0 cell for the A1 row in the A register) which act as the output switches for the memory cells 100 in the S0 vertical column will be made conductive, so the gate storage capacitor of a cell will, if it is charged negative, cause the transistor 104 of the cell to be also conductive, and the output line 105 will be grounded. Thus, if an 0 is stored, a 1 will appear on output line 105. Throughout the system; 1 is ground or $V_{SS}$, 0 is a negative voltage or $V_{DD}$. This output line 105 is inverted or is in "false" rather than "true" logic; bits are stored in true and read out in false or complementary logic. Input to the cell is on a line 106 through a transistor 107. When the S1 address line 101 goes negative, the transistor 107 cuts on and a negative voltage on line 106 will be stored as a charge in the gate of transistor 104. The inputs to the line 106 may be from the ALU 22, from a recirculate path in the selector gates 24, or from a transfer path from another register via the gates 24. The output line 105 may go to the ALU 22, to a right shift path in selector gates 23, to a recirculate path in gates 24, or to a transfer path in the gates 24. For recirculate, the left-hand end of the output line 105 goes into a one-bit delay circuit 108. Each one-bit delay includes two inverters clocked at $\phi2, \phi3$ and $\phi4, \phi1$, respectively. Depending upon the settings of the selector gates 23 and 24 and other conditions, the bit on line 105 can be either recirculated, or passed through the ALU, left-shifted, right-shifted, etc. If the bit is to be merely recirculated, the gates 24 are set by the OPCODE field of the then-present instruction word in the I-Reg 31 via ALU logic 25 so the bit will pass through a complex gate 109 to appear inverted on line 106, delayed by 1½ state times; that is, the bit leaves its storage capacitor in cell 100 on $\phi1$ of a given state time, then that state time proceeds through $\phi1–\phi2–\phi3–\phi4$ as defined in FIG. 3A as the bit propagates through the delay 108. The S0 address line becomes de-energized or goes to ground at the end of $\phi3$, and S1 goes negative on $\phi1$ of the next state time as the commutator 21 switches to the next stage to the left. On $\phi3$ of this next state time, gate 109 is enabled by $\phi3$ which is one of its inputs, so the bit can proceed to line 106. Back at the cell, the transistor 107 is now conductive, and the bit will be re-entered into the same cell it came out of, i.e., the S0 cell. All bits in all cells 100 of this first vertical column S0 will be recirculated or refreshed during S0–S1 time, during every instruction cycle, unless they are being transferred or operated on in the ALU or shifted. If the bits in B register are being transferred to the A register, the gates 24 are activated by part of the decoded instruction word appearing on line 110 in such manner that the bit on output line 105 will not go through gate 109 for the A1 row, but instead will go by line 111 through gates 109 in the B1 row to the B1 input line 112. As before, when line S1 comes on in the next state time, the bit will go back into a memory cell, but this time it will go into cell 113 in B1. The bit that was in cell 113 will, during this same time, travel via output line 114 for B1 through a delay circuit 108 then into gate 109 for A1 by a line 115. Transfer of all bits in A1 to B1, and all in B1 to A1, would thus proceed for a cycle of S0 to S10. The remainder of the A and B registers, i.e., A2–B2, A4–B4 and A8–B8 would be exchanged during the same cycle by the same mechanism.

The gates 109 have the function of defining which output lines from the rows of the SAM are connected to the row input lines. For the A register, the gates 109 pass either the output of delay 108 of the A1, A2, etc. rows for recirculate, or the delayed outputs from the B1, B2, etc. rows for "exchange A and B" or A←→B. The same applies for the B register. The C register cannot be exchanged and so gates 116 for rows C1, C2, etc. only receive delayed C output lines and a recirculate command from a line 117. A decoder 118 produces the recirculate commands $\overline{A \text{--->} A}$, $\overline{B \text{--->} B}$, $\overline{C \text{--->} C}$ from $T \text{--->} C$, $T \text{--->} B$, $T \text{--->} A$ signals on lines 119 which come directly from the arithmetic control PLA 25. The exchange command A←→B on line 110 comes directly from PLA 25, and also goes into decoder 118. Logically, the effect of this control arrangement is that the A, B and C registers will be recirculated when not being exchanged A←→B or the ALU output T is not being written into the register. That is, if a register is not being written into, it defaults to recirculate.

At all times, the output lines 105, etc. from rows A1, A2, A4, A8 are connected via lines 120 to the inputs of the segment decoder 42. One digit from register A is selected during each instruction cycle, as set forth in FIG. 3C, to be gated into the decode 42 as will be later explained, but the register A outputs always appear at the decoder 42 inputs 120. The B1 and B2 row output lines are also connected to the decoder 42 inputs and these are used for outputting the decimal point and outputting a blanking signal, as for overflow indication. During calculations, the decimal point position is in the S0 bit locations in each register, then upon display the DPT position is manifested by a 1 in the row B1, which is thus fed to the segment decoder 42 via line 121. Row B2 output is connected via line 122 to the decoder 42 to permit an indication such as flashing the display to be implemented.

The selector gates 23 on the right-hand side of the SAM 20 control the output of the A, B and C registers into the ALU 22 and the entry of data from the ALU 22 back into the A, B and C registers. Also, constants are selected by the gates 23, and right shaft may be performed. The adder inputs to the ALU 22 are X1, Y1, X2, Y2, X4, Y4, X8 and Y8. Register A or register C outputs can be applied to the X inputs to the adder, and register B output can only be applied to the Y inputs; X input select gates 122 and Y input select gates 123 determine this in response to controls on lines 125, 126 and 127 which represent $\overline{C \text{--->} X}$, $\overline{A \text{--->} X}$ and $\overline{B \text{--->} Y}$ commands that are produced in the arithmetic control logic array 25. The gates 123 also control entry of a constant K into the Y inputs to the adder, and for this purpose receive a K ---> Y command on line 128 which is generated in array 25. The constants K, which may be $\overline{K1}$, $\overline{K2}$, $\overline{K4}$ or $\overline{K8}$, are generated in the digit mask logic 35 on lines 129. The K1 line goes only to the gate 123 for the B1 row, K2 line goes only to the gate 123 for the B2 row, etc. Thus, to perform the function of "add one to A", the K ---> Y line 128 would be energized and the logic 35 would produce $\overline{K1}$ on one line 129, while the data from B1 row output 114 on line 130 would be blocked at gate 123, since B ---> Y command would not appear on line 127. Usually a digit mask would occur during this operation, but regardless of the mask the constant is to be added on only the first digit, not all digits. This is accomplished by the gates 218 which receive a 'DM or leading edge of digit mask signal on line 219.

The outputs from the ALU 22 are on lines 131 labeled T1, T2, T4, T8. These are applied as inputs to 12 identical complex gates 132, each of which has its output directly connected to the input line of one of the 12 rows of the SAM 20. The T1 line goes to gates 132 for the A1, B1, C1 rows, the T2 line goes to gates 132 for the A2, B2, C2 rows, etc. These gates receive commands $\overline{T \text{--->} A}$, $\overline{T \text{--->} B}$, $\overline{T \text{--->} C}$ on lines 119 to define whether the ALU output T is entered into the A, B or C register. Each gate arrangement 132 also receives an input 133 from one of the row output lines, for right shift purposes.

A right shift command $\overline{SRM}$ on line 134 causes the gates 132 to complete the connection from lines 133 back to the row input lines 106, etc. With only one-half state time delay. A particular register is selected for right shift by a command on one of the lines 119, e.g., $\overline{T \text{--->} A}$, along with an $\overline{SRM}$ command on the line 134. $\overline{SRM}$ is generated from $\overline{SR}$ line 135 in the arithmetic control array 25 via gate 136 in the ALU 22. SR on line 137, which is inverted as an input to gate 136, is also applied as an input 138 to complex gates 140 which determine the T outputs from the ALU. The input 138 functions to disenable the T output upon a right shift command so nothing in the adder gets applied back into the SAM. The gate 136 which generates $\overline{SRM}$ also receives a timing signal $\overline{DM'}$ on line 141 which is a modified digit mask. $\overline{DM'}$ occurs at the falling edge of the digit mask which may be S2 to S10 or mantissa mask, for example, and lasts for one state time or S0 in this example. The function here is to insert a zero in MSD upon right shift; in the right shift operation the LSD is lost and is not coupled back to be inserted in the MSD position. During calculations, numbers are stored in the register "left justified", meaning that the most significant digit is in the leftmost position; this is to preserve MSD, since the LSD is always truncated upon overflow. Then, upon display, a number is shifted all the way to the right, to eliminate insigificant trailing zeros. Also, right shift is used to normalize two numbers being added, e.g., 123,45 plus 6.789 would be left-justified and normalized to 123.45000 and 006.78900. These are merely examples of right shift operations.

The flag registers 26 and 27, the D-scan register 45, the state timing matrix and the digit mask 39 are also part of the SAM, and will be described later.

THE ARITHMETIC LOGIC UNIT

The ALU 22 basically consists of a bit-parallel, serial-digit, binary adder 150 and a BCD corrector 151, along with the left shift arrangements 138 as noted above. Each parallel stage of the adder includes a carry/borrow circuit 152. The adder performs subtraction by twos complement addition.

The four parallel stages 153, 154, 155, 156 process the 1 bit on inputs X1, Y1, the 2 bit on inputs X2, Y2 from the SAM, the 4 bit on X4, Y4 and the 8 bit on X8, Y8, respectively, and ultimately produce the outputs T1, T2, T4 and T8 on lines 131 going back to the SAM. Each stage 153–156 receives a subtract command $\overline{SUB}$ on line 157, and SUB on line 158. SUB is generated in arithmetic control array 25 at output 159. The stages 153–156 perform straight binary addition unless SUB is present, then they perform subtraction by two's complement addition. Considering stage 153 for the 1 bit, a complex gate 160 produces an output 161 which is logically $\overline{X1 \cdot Y1}$, i.e., the inverse of X1 "and" Y1. A complex gate 162 produces an output 163 which is in logic notation $\overline{X, \oplus Y1}$, i.e., the inverse of X1 "exclusive OR'd" with y1. The Y inputs to the complex gates 160 and 162 are selected between Y and $\overline{Y}$ for addition or subtraction. The outputs 161 and 163 go through a precharge-discharge carry/borrow circuit 152, which receives a carry input on line 164 from a prior digit (if any) and propagates a carry output C1 to the next stage or bit 2 on line 165, and carries are propagated from bit 2 to bit 4 on line 166 and from bit 4 to bit 8 on line 167. A true carry indication appears on line 164 for bit 1, which is an input to complex gate 168 that produces an ouptut on line 170 as the adder output. The complex gate 168 produces the inverse of the "exclusive OR" of information on lines 163 and 164, that is $\overline{X \oplus Y}$ and Cin. The adder stage 153 including complex gates 160, 162, 168 and carry circuit 152 produces a binary 1 output at 170 when X or Y inputs are 1 and Cin is 0, or when X and Y are 0 and Cin is 1, or X and Y are 1 and Cin is 1, this being standard binary addition. Likewise, a binary 0 is produced at 170 when X and Y are 0 and Cin is 0, when X and Y are 1 and Cin is 0, and if X or Y is 1 and Cin is 1. Stages 154, 155 and 156 operate the same way, with complex gates the same as 160, 162, 168, to produce sums on line 171, 172, 173. A carry or borrow output is produced at line 174 as an output of gate 175. The gate 175 receives the carry output 176 from the precharge-discharge carry/borrow circuit 152 of the bit 8 stage 156 of the adder, and also receives $\overline{SUB}$ on line 158, so the gate functions to produce an inverted carry (which is a borrow) for subtraction and a true carry for addition. The adder outputs 171–173 and the carry output 174 are applied as inputs to a complex gate 177 which examines the adder output to see of a valid BCD code appears. If not, it causes the BCD corrector to add 6 for addition or add 10 for subtraction. For example, addition of decimal numbers X = 5 and Y = 3 in the adder 150 produces binary output 1000 on lines 170–173, which is a valid 8 in BCD. But adding X = 5 and Y = 7 produces an output 1100, which is invalid in BCD. Adding six or 0110 to 1100 in BCD corrector 151 produces an output on T1–T8 lines of 10010 with the MSD being a carry and executed via C/B circuitry. So, two plus a carry is the result, this being proper for BCD. The BCD corrector 151 includes three binary adder stages 178, 179, 180. Note that the 1 bit never needs to be BCD corrected so the output 170 from 1's bit adder stage 153 goes directly to complex gate 140 or T output (with delays and clocking, of course). Stage 178 includes a carry generator 181 but no carry in, and the carry out from this stage goes to a carry generator 182 in stage 179 via line 183. A carry out from stage 179 goes to stage 180 via line 184. Stage 180 includes no carry generator since this function is accounted for in the BCD control and C/$\overline{B}$ generator. Outputs 185, 186 and 187 from the BCD generator adder stages 178, 179, 180 are applied to inputs to the complex gates 140, to produce T2, T4, T8 outputs.

A zero, six or ten is added in the corrector 151 by circuits 188 at the outputs of adder stages 178–180. If line 189 is actutated by BCD corrector control 190, then all the stages receive a $V_{DD}$ or 0 input; this happens when circuit 177 detects a valid BCD output, i.e., when the numbers added do not exceed 9 or 1001, or when a "corrector kill" command is present on line 191 from the arithmetic logic array. Corrector kill would be used when the floating minus sign, e.g., a hexadecimal 14 (1110) or 15 (1111), is processed through the ALU, o when the exponent digit is processed since this migh be in hexadecimal. SUB line 157, gated at $\phi4$, is an other input to control 190, and is inverted as an inpu to one gate and is a direct input to the other, so that on of the lines 192 and 193 is actuated to turn on a combi nation of transistors in the circuits 188 to add in eithe 10$\underline{10}$ (ten) or 011$\underline{0}$ (six) by connecting selected input of the adder stages 178–180 to $V_{SS}$ or 1 , or to $V_{DD}$ which is 0.

The carry or borrow input 164 to the 1's stage 153 o the adder is generated in a complex gate 195 which i responsive to SUB input 157, to an input 196 which i the $\phi$1-clocked output 197 of the circuit 177 that detects a carry out at 174 or an invalid BCD code, and tc $\overline{DM}$ on line 198 which is the leading edge of digit mask. The circuit 195 produces a Cin when the prior digit produced a carry in addition, and also adds a 1 to the first bit by introducing a carry Cin upon subtraction to implement the 2's complement. The 2's complement is done by inverting all of input bits and adding a 1 to the 1's stage 153 of the adder. Also, the circuit 195 implements "borrow" in subtraction by inverting the "add 1" just described, so in effect 1 is subtracted.

Shift left is implemented in the complex gates 140 by causing the BCD corrector outputs 179, 185, 186 and 187 from the adder to go through the $\phi3$, $\phi4$, and $\phi1$, $\phi2$ clocked gates, in response to actuation of SL command on line 199 from the arithmetic control array 25. This delays the adder output bits for one state time, making 2½ state times delay for left shift.

Timing through the ALU may be understood by tracing a bit from a location in the SAM to the ALU and back. A bit stored on the gate of transistor 104 in the A1 row of the SAM is read out through transistor 103 at S0$\phi$1 when the S0 address line 101 goes negative. The bit comes out on line 105 inverted or false. It goes into gate 122 where it is delayed one clock time; that is, it leaves gate 122 on S0$\phi$1 since this gate is clocked $\phi$1$\phi$2. Then the bit goes into the X1 inputs to complex gates 160 and 162 in bit 1 stage 153; these gates are not clocked so it subsists in the adder for S0$\phi$2 through S0$\phi$4 when it is clocked out of output line 170. The carry circuits 152 are clocked or precharged on $\phi$3, as the output must subsist through $\phi$4 to be valid, i.e., to allow the carry circuit to conditionally discharge. Some delay occurs in the complex gates 160, 162, 168 of the adder. The output 170 of the adder goes through an inverter clocked at $\phi$4$\phi$1 so the bit arrives at the input of gate 140 at S1$\phi$1. With no left shift command, there is no delay in the gate 140, so the bit comes back on T1 line 131 to the selector gate 132 for row A1, and this gate is clocked at $\phi$2$\phi$3, so the bit reaches the row A1 input line 106 at S1$\phi$3 which is 1½ state times after it left. Now, the S1 address line 101 is negative, which turns on the transistor 107 and writes the bit back into the gate capacitance of the same transistor 104 that it left at S0$\phi$1. Date is always read out of the SAM on $\phi$1, and written into the SAM on $\phi$3. If a shift right operation is being implemented, the bit would leave a cell such as S5 in A1 row at S5$\phi$1, go into input 133 of gate 132 at S5$\phi$1, be delayed as gate 132 is clocked $\phi$2$\phi$3, then appear on input line 106 at S5$\phi$3 which is only ½ state time delay. S5 address line is still actuated, so the bit cannot be written into the S5 position. Thus, it would be right shifted and go into the S4 cell. For shift left, the bit would leave at S5φ1 and be delayed 2½ state times so it would come back at S7φ3 and be written into the S6 cell.

Upon right shift, the LSD is lost rather than "endaround" shifted. The S0 digit is used for DPT or EXP, so it should never be shifted to S10 in shift right. Thus, the circuit 136 causes a zero to be inserted at S0 on right shift, or at the end of digit mask, so the S0 bit is not written into the S10 cell.

THE DIGIT MASK LOGIC

The digit mask logic 35 is a part of the SAM or is tied to it and uses the same S0–S10 lines 101. This circuitry generates 16 possible masks M0–M15 as seen in FIG. 9 each of which may have one of 16 possible constants associated with it, as produced on lines K1, K2, K4, K8, and all masks and constants are gate programmable. The 16 masks and constants are defined by four bits of the instruction word in instruction register 31. These four bits $\overline{I0}, \overline{I1}, \overline{I2}, \overline{I3}$ are read out of the instruction register into a four bit register 200 which is interleaved with the bit address lines 101 of the SAM. The shift register consists of a sequence of eight conventional inverters 201 with coupling between stages being clocked at φ1, φ2 to read in four bits in four state times as supplied serially on input line 202 from I Reg 31. The shift register produces time true and inverted representations of I0–I3 on parallel output lines 203; these output lines are labeled $\overline{I0}$, I0, $\overline{I1}$, I1, $\overline{I2}$, etc. The outputs 203 are gated into the encoder portion 204 of the PLA by devices 205 by an S10φ3 signal generated in gate 206. The encoder portion 204 includes sixteen horizontal lines 207 which are P-diffusions, while the vertical lines 203 represent metallization stripes, as do the bit address lines 101 for the SAM with which the lines 203 are interleaved. Each of the lines 207 is connected to a separate load on the left end, and the right end is gated at φ3 into a decoder array 208. A 4 bit code on I0 to I3 selects one of the 16 lines 207, defined by the pattern of gates 209 or "thinned oxide" which forms operable MOS transistors between the P-diffusions 207 and $V_{SS}$. For example, if the digit mask part of the instruction word is "thirteen" or 1101, the line 210 coded 1101 will be actuated and no others will be. This line will be actuated only when certain state times are present, however, as defined by gates 211 on the lines 101. For example, mask 13 or M13 may be for the exponent at S0 and S1, so gates would be on all the and address lines 101 except S10 and S0; this produces an output on line 212 in the decoder 208 only during S0 and S1 time when I0 to I3 are at 1101. A line 213 produces an output for any of the digit mask signals on the lines 207 since gates are at all locations. This output is gated at φ1 and becomes a DM or digit mask signal on line 214 which goes to digit mask logic gates 215 and other locations. Also, a constant or K input to the lines 129 in the selector gates 23 is produced. In this example, a constant of 1 or K1 is generated by a gate 216 above line 217; line 212 represents a metallization stripe and line 217 is a P-diffusion. The output on line 217, clocked at φ1, is applied to one of a set of NAND gates 218 and thence to K1 line 129. Another input 219 to gates 218 is a digit mask signal. Usually the constant should only be added in during the first digit of the mask, so this gating arrangement prevents entry of the constant at unwanted times.

An ungated digit mask signal is provided on line 220 which is connected to line 213. This signal goes to flag logic 28.

The digit mask logic 35 can produce sixteen different masks, each with a selected constant K1, K2, K4, K8 or no constant, in any combination. The masks and constants are gate-programmable in the encoder and decoder arrays 204 and 208. FIG. 9 shows one way that the digit mask logic 35 may be programmed.

THE STATE TIMING MATRIX

The state timing matrix 222 is also an integral part of the SAM 20. This device generates timed signals like the mask generator, but these occur every instruction cycle rather than only on command from the I0 to I3 part of the instruction word. A line 223 produces an S10 signal which is used at several points in the system, such as an inverted input 224 to the digit mask logic gate 215 to provide mask-to-mask protection and as inputs to the flag logic 28. A line 225 provides an S9 signal which is inverted and gated at 226 to provide an input 227 to the digit scan 44. An $\overline{S10}$ signal produced on line 229 is used in the input and condition logic circuit 40. An S10 to S7 signal on line 230 is used in the display output arrangement. An $\overline{SBL}$ or S blank signal on line 231 is a 0 at S10 to S0 and a 1 at S1 to S9; this is used as the display scan and output as will be explained. An important point is that all of these signals are gate programmable in manufacture, so the timing may be selected in accord with system requirements. The structure of the state timing matrix is set forth in application, Ser. No. 255,856, filed May 22, 1972, by Michael J. Cochran et al. This device is referred to as a push-pull matrix. The output lines 223, 225, etc., are P-diffusions which may be connected to $V_{SS}$ or $V_{GG}$ by programmable gates at each intersection with metallization lines 101. A circle represents a gate or area of thinned oxide under the metal line 101 between the P-diffusion line 223, et seq., and an adjacent P-diffusion line which is connected to $V_{SS}$. A square represents a gate to a P-diffusion line which is connected to $V_{GG}$. Thus, the output line is driven to either $V_{SS}$ or $V_{GG}$ (1 or 0) during each state time depending on the position of the gate.

Note that signals such as $\overline{S10}$ may be obtained directly from the address lines 101, such as at line 232, but such connections are not gate-programmable and do not provide high level signals.

THE S.A.M. ADDRESS COUNTER

The address counter 21 is made up of eleven identical stages 235, each of which contains two inverters stages 236 with interstage clocking at φ2 and φ4. The output of the second inverter is connected to a device 237 and also through a clocked inverter 238 to a device 239. The devices 237 and 239 alternately connect the output or address line to θ or $V_{SS}$. θ is generated in a circuit 240 such that it is a level near $V_{GG}$ except during φ4; this circuit prevents power drain during φ4 when θ is at ground.

The gates on the line 102 cause the address counter to circulate a 0 which advances from right to left and starts over after it reaches the S10 line. The state time signals produced on lines 101 or S0 to S10 subsist only during φ1, φ2, φ3 of a state time cycle.

DIGIT SCAN GENERATION

The digit scan is generated in the digit scan register 44 along with the D-scan register 45 which is part of the SAM. The register 45 contains 11 bits, like the flag registers, and is sequentially addressed by S0–S10 signals like the remainder of the SAM. This register functions to circulate a single bit, right shifting each D time, to generate the display scan or data out sequence of FIG. 3C. Right shift is implemented by connecting output line 241 from the SAM cells of this row through gate 242 clocked at $\phi2$, $\phi3$ so that a bit read out of a cell on line 241 is written back into the adjacent cell via line 243 during the same state time that it was read out, so it is right shifted. Only one bit in the register will contain a 0; this is part of the function of the power up clear circuit which produces inputs on lines 244 and 245. Once each D time, a bit will come out on line 241 at an S time dependent on the status of register 45. This state time signal on line 241 is connected through two inverters to a line 246 which is connected to three places. First, it is used to gate digits into the segment decoder by devices 247. That is, as the SAM is sequentially addressed, all of the digits in the A register are presented to the input lines 120 to the segment decoder 42, but only one digit gets gated through the devices 247 to go into the decoder. The particular digit depends upon the S time at which an output from register 45 appears on output line 241 and thus on line 246. Secondly, the signal on line 246 is used to start the digit scan register 44. When an output occurs on line 246 at S9 in coincidence with S9$\phi$3 on line 248, a bit is started into the first stage of a nine stage register 250 made up of states 251. The bit does not generate an output on D1 until S0$\phi$1 when the other gating line 252 of the shift register stages 251 is actuated. All other outputs from the D-scan register 45 except at S9 do not affect the digit scan register 44. The third function of the output on line 246 is to generate a D10 signal for use in the segment decoder on a line 253 in the output PLA 42. D10 is generated by first detecting coincidence between the output on line 246 and S10 by device 254, then gating at (S0 ---> S8)$\phi$1 and S10$\phi$3 at devices 255 and 256. A D1 signal is also generated from D10 on a line 257. These D1 and D10 signals and their complements are used to reset the zero suppress latch and other functions such as assuring blanking on certain digits.

The digit scan register 44 includes nine shift register stages 251 with interstage clocking at S9$\phi$3 on line 248 and (S1 ---> S8)$\phi$1 on line 252. The register counts to nine, beginning after coincidence of an output on line 246 from the D-scan register 45 and S9, to produce D1 ---> D9 signals on outputs 258. Output buffers 259 are needed to provide a proper signal level to drive the large capacitance of the keyboard switch matrix, the output connections, etc. A D10 signal on line 410 is also generated in the register 44 at output stage 260; this signal does not exist during time out, so it differs from the D10 generated at 253. Inputs to the NAND gates in the stages 251 for D3 to D9 from a line 261 function to blank D3 to D9 during "Wait DK," so none of the key switches except on D1 and D2 will function to produce inputs on the K lines. A wait DK signal is produced on line 262 which originates in decoder 263 for the four special instructions in logic array 28. Wait DK and the $\overline{SBL}$ signal on line 231 are used as inputs to a gate 264.

The wait DK buffer 265 generates a DK signal during time out or wait DK in response to a signal on line 262. DK is a continuous or D.C. voltage rather than a timed signal. A single key switch is thus actuated during time out to restore the display. This saves power by eliminating the need to drive all the D output circuitry. This pin out may also be used in the test mode. When TEST exists on line 266, then the word in the instruction register may be read out via line 336.

THE SEGMENT DECODER

The output to the display is provided through a segment decoder 42 which is a programmable logic array having a first encode portion 268 and a second decode portion 269. The programmable logic array is of the type described in U.S. Pat. No. 3,702,985, assigned to the assignee of this invention. The encoder 268 of the PLA receives as inputs the A register outputs on lines 120, and B1, B2 on lines 121, gated in at S10$\phi$3, with specific digits being selected in decending order as mentioned above. Thus, the input data and its complements appear as inputs 270 to the encoder portion 268. Also, D10 and D1 inputs appear on lines 253 and 257 along with complements. Other inputs include wait DK on line 271 from line 262, and part of the zero suppress latch on line 272, along with complements of these. A direct low voltage indication, such as an L on the display, is provided by a line 273. The array is programmed by gates to actuate selected ones of the lines 274 depending upon the desired output segment code such as set forth in FIG. 4B. To conserve power, the lines 274 are energized only at S10$\phi$3 by clocked loads 275, and the lines 274 are only connected to decode part 269 on S10$\phi$3 which turns on devices 276. S10$\phi$3 is generated on line 277 from the S10 output 223 from the push-pull matrix 222. The zero suppress function is implemented by a latch including a line 278 in decoder part 269 which feeds back to line 272 and blanks everything until a zero or decimal point code occurs then the latch flips to display everything after that on the particular scan cycle. Zero suppress is reset every scan cycle, and also is inoperative at the left most digit so that a minus sign or other annotator is shown, as well as on D9 so that a zero will show in the last place if nothing is in the A register except zeros. The output 269 is gateprogrammed to produce the code of FIG. 4B. The low battery indication is provided via line 273 on the SH segment through an output buffer 279.

Segment outputs are provided by segment buffers 280 which provide signal levels high enough so that no segment drivers are needed. These are programmable to provide either 1 or 0 ouputs. Display blanking is provided by both series devices 281 and shunt devices 282 which are driven from a blanking signal on line 283. Output is permitted only when series devices 281 are on, i.e., o is on line 283, and shunt devices 282 are off. The blanking signal is generated in logic gate 284 which is responsive to wait DK on line 271 or D1 on line 257, and a "display on" signal on line 285 which is generated in the input and condition logic 40 from a "display on" latch 286 responsive to special instruction $\overline{SNO}$ and branch on KO or KP (as well as TEST), and $\overline{SBL}$ on line 231.

POWER UP CLEAR

A power up clear latch 288 functions to cause the address register 36, 37 to go to all zeros and to place a bit in the D-scan register 45. The latch always comes up in the set condition when power is turned on, producing CLEAR on line 244 and $\overline{\text{CLEAR}}$ on line 289. Also, the "and" of D1 on line 257 and KO on line 290 sets the clear latch. That is, the clear key C appears on the keyboard matrix at D1KO. The clear latch 288 is reset by the occurrence of $\overline{\text{CLEAR}}$ on line 289, $\overline{\text{S10}}$ on line 232, feedback to the SAM address counter 21 on line 102, and $\overline{\text{S9}}$ on line 291. Thus, to reset, the state counter must cycle through over more than one complete sequence. This gives time for all zeros to be added into the address register 36, 37 via $\overline{\text{CLEAR}}$ line 289 which cause the gate 292 in the Add-1 or recirculate loop for the address register to add in zeros. After the address register is returned to the all zero position, the program is such that it cycles through a series of instructions which zero the A-Reg, B-Reg, flags, etc.

THE READ ONLY MEMORY

The ROM 30 consists of 3520 identical memory elements 300, each or which is defined by the presence or absence of a gate or thin oxide at a location where an X line 301 intercepts a Y line 302. The X lines 301 are metallization stripes, and the Y lines are P-diffusions. In conventional ROMs, a ground line is provides for each pair of Y lines or output lines, but in this invention, there is only one ground or $V_{SS}$ line 303 for 5 (or 10 if shared) Y lines 302. Thus, the ROM can be much smaller in area because perhaps 40% of the P-diffusion lines are not needed. The Y-decode logic 39 provides the usual function of selecting one of the Y lines in a group, and also provides the function of connecting the selected Y-line to an output line 304, and connecting an adjacent P-diffusion line 302 to the $V_{SS}$ line 303. These functions are produced in the Y-decode logic 39 by a number of MOS transistors 305 arranged in an appropriate pattern, with the gates of these transistors being connected to receive outputs from the Y address register 37 on lines 306. The three Y address bits A6, A7, A8 are used to select one-of-five of the Y lines 302 in each of the eleven portions of the ROM; to this end, these address bits and their complements $\overline{A6}$, $\overline{A7}$ and $\overline{A8}$ appear on six output lines 307 from the Y address register 37. The address signals on line 307 are gated into the lines 306 via inverters 308 which are clocked at S3φ4 to S4φ3 by a signal appearing on line 309. The lines 307 are forced to $V_{DD}$ or 0 at all times except S3φ4 to S4φ3 by devices 310. The X decode section 38 functions to select 1 out of 64 X lines 301 using six X address bits and their complements existing at 12 X address lines 312. These are gated into the lines 312 of the X decode section 38 at S4φ1 by devices 313. The lines 312 are metallization, overlying 64 P-diffusion lines 314. The lines 314 are are charged to $V_{GG}$ through devices 315 which are turned on at all except S5φ3 to S4φ3, using the signal time from line 316 which has been twice inverted to appear on line 317. The times signal on line 317 also functions to connect all of the lines 312 to $\overline{V}_{SS}$ at all times except during S3φ4 to S4φ3, via devices 318. This timed signal on line 317 also functions to precharge all of the Y-lines 302 to $V_{DD}$ via devices 319 during all times except S3φ4 to S4φ3. During S3φ4 to S4φ3, the Y-lines 302 are floating, i.e., devices 319 are off, and the selected Y-lines are conditionally discharged. The X-lines 301 are not all precharged, thus saving power. Only one of the X-lines 301 will be at logic 0 or a negative voltage, depending upon which one of the lines 314 was selected in X-decode 38, and this will occur only during S4φ2φ3 when a line 320 is at $V_{GG}$ level. The X-lines 301 are connected to line 320 via devices 321. P-diffusion lines 314 are connected to metallization on the gates of devices 321, then P-diffusion drains of the devices 321 become metallization as lines 301. Only one of the devices 321 will have $V_{GG}$ on it for a given X address, the remainder will be shorted to $V_{SS}$ via the pattern of gates in the decoder. The line 320 is switched between $V_{SS}$ and $V_{GG}$ by logic 322 which receives the S3φ4-S4φ3 signal on line 316 and a signal on line 323 which is at $V_{SS}$ on φ2φ3 and at $V_{DD}$ on φ4φ1.

The cycle of operation of the ROM will now be explained. During each instruction cycle or D time, at a point just prior to S3φ4, all of the lines 314 will be charged to a 0 or $V_{GG}$, all of the lines 312 will be at 1 or $V_{SS}$, all of the Y-lines 302 will be at a 0 $V_{DD}$, all of the X-lines 301 will be at 1 or $V_{SS}$ via line 320, all the lines 306 will be at 1 or $V_{SS}$, and all of the Y-decode transistors 305 will be turned off. At S3φ4 the line 316 goes to a 1 or $V_{SS}$, isolating lines 314 from $V_{GG}$ by devices 315, isolating lines 312 from $V_{SS}$ by devices 318, isolating Y-lines 302 from $V_{DD}$ by devices 319, and removing $V_{DD}$ from lines 317 by devices 310. The X-lines 301 are all still at 1 or $V_{SS}$ so none of the cells 300 will conduct. Next, the S4φ1, the X and Y addresses will be applied to lines 312 and 307 via devices 313 and 325. The X address on lines 312, due to the pattern of gates 326, will cause all of the lines 314 to be connected to $V_{SS}$ except one which is the selected one-of-sixty-four X line that remains charged to $V_{GG}$. Thus, the gate of only one of the devices 321 will have a 0 or $V_{GG}$ on it. At this time, the lines 306 in Y-decode 39 will have 1's and 0's on them to selectively turn on devices 305 in a pattern to select one-of-five of the Y-lines 302 in each of the eleven Y segments of the ROM. Four of the lines 302 will discharge to $V_{SS}$ at this point, i.e., those on the $V_{SS}$ side of the selected Y-line. The remainder will still be charged to $V_{DD}$. Next, at the beginning of S4φ2φ3, the line 320 goes to $V_{GG}$ as determined by logic 322, and so the selected X line 301 will go to $V_{GG}$ or 0, the remainder staying at $V_{SS}$ because all but one of the devices 321 are turned off. This will turn on the gates 300 in each of the eleven parts of the ROM 30 for this particular X line 301. As determined by the pattern of gates 300, some of the output lines 304 will be discharged to 1 or $V_{SS}$ through gates 300 and devices 305 and others will remain at $V_{DD}$ or logic 0, producing an eleven bit instruction word on lines 304 which stays through the time period S4φ2φ3. This word is forced loaded into the instruction register 31 via devices 328 upon the occurrence of a Load I signal on line 329. Load I occurs at S4φ3 of every instruction cycle, unless a special instruction exists which prevents a word from being read out of the ROM and allows the existing word in the instruction register to recirculate. At the end of the S3φ4-S4φ3 signal, the ROM goes back into the mode that existed just prior to the beginning of S3φ4. That is, all the lines 306 are at 1, all devices 305 are turned off, all the devices 315, 318 and 319 are turned on, the line 320 is at $V_{SS}$, etc. Thus, the ROM and its address circuitry operates only during the S3φ4-S4φ3 window, and operates in a unique precharge-discharge mode, which along with the conservation of space for ground lines, provides a good compromise of speed, size and power requirements.

THE INSTRUCTION REGISTER

The instruction register or I Reg 31 comprises eleven identical shift register stages 330, with each stage including two inverters, the first of which is clocked at $\phi 1$, $\phi 2$ and the second is clocked at $\phi 3$, $\phi 4$. The stages are labeled I0 to I10 corresponding to the 11 bits of the instruction word as illustrated in FIG. 5. The register 31 will recirculate via a path 331, with the bits advancing one stage for each state time, so the same word remains in the I Reg until a new word is forced in from the ROM 20 on output line 304 via devices 328. Outputs from the I Reg include lines 332 which connect I1 to I5 to the X address register 36 as address bits A1 to A5, and lines 333 which connect I6, I7 and I8 to Y address register 37 as address bits A6, A7, A8; these lines 332 and 333 are coupled to the address register through devices 334 which are gated on only when a $\overline{\text{JUMP}}$ signal occurs on line 335. $\overline{\text{JUMP}}$ occurs during S3$\phi$1$\phi$2 so that the address may be loaded into the address register, shifted one stage at S3$\phi$3$\phi$4, and then gated into the X and Y decode on S4$\phi$1. Other outputs from I Reg include a connection from I0 via line 336 which is an input to the wait DK logic, by which an instruction may be read out of the I Reg during Test, via the DK pin. Also, I3 is connected via line 337 to a five stage shift register 336 for flag and arithmetic control logic arrays 28 and 25, so that bits I4 to I8 can be read out serially from I Reg to be decoded in these logic arrays; this read out operation requires five state times, S6$\phi$1 to S10$\phi$1, then at S10$\phi$3$\phi$4 a signal on line 339 gates the bits I4 to I8 into the flag and arithmetic logic arrays for decoding. Another output from I Reg is a set of four lines 340 connecting I7, I8, I9 and I10 to the input and condition logic circuits 40 to implement the class functions of FIG. 5. I9 is also connected via line 341 to the input 202 of the register 200 in the digit mask logic 35 so that I0, I1, I2 and I3 may be read into this register for decoding; I0 comes out on line 341 at S7$\phi$1, and this continues to I3 at S10$\phi$1, then the bits are gated into the array 204 at S10$\phi$3 by devices 205.. The other output from I Reg is a line 342 connecting I9 to an input to the Y address register 37; note that the 9 bit address is loaded from I Reg 31 to the address register 36, 37 on S3$\phi$1$\phi$2, then shifted once before loading into the address decode. Thus, no bit is loaded directly to A0.

The sequence of operation of the instruction register will now be described. At S10 of each instruction cycle, an instruction word will have been serially read into the registers 200 and 338, and so is dumped into the decode portions of the mask, flag and ALU logic arrays 35, 28 and 25, respectively, at S10$\phi$3 for decoding and execution beginning at S0 for the next instruction cycle. Then at S3$\phi$1$\phi$2, if a jump is to occur, the address to which the program is to jump is transferred from I Reg to the address registers 36 and 37 via lines 332, 333 and 342. The address is shifted once, decoded starting at S4$\phi$1, and the 11-bit instruction word found in the ROM at the decoded address is loaded into I Reg via lines 304 at the occurrence of Load I at S4$\phi$3. Or, if a jump is not to be executed, the address register is incremented by one stating at S4$\phi$1 and finishing just prior to S4$\phi$1 of the next cycle, and the new address is decoded in the same manner, a new instruction word is loaded into I Reg on S4$\phi$3, etc. The remainder of the cycle is used for serially loading the instruction word from the I Reg into the registers 200 and 338 as the word recirculates in I Reg.

THE ADDRESS REGISTER

The address register is made up of two parts, the X address register 36 and the Y address register 37, which operate as one eleven-stage shift register, each stage having two inverters 343 with interstage clocking at $\phi 3$ and $\phi 4$. The output of the last stage of Y register 37 is connected directly to the input of the first stage of register 36 via line 334; a bit entered at the LSD or $\overline{A0}$ will eventually propagate to the MSD of Y register 37. The address register is usually incremented by one, except when a jump or branch is executed, and incrementing is accomplished by connecting the output of the LSD stage or A0 stage of the X register 36 via a line 345 to a logic arrangement 346 in the input and condition logic 40, and connecting the output of logic 346 via a line 347 to the input of the Y register 37. An important feature of this system is that the address register 36, 37 may be repeatedly incremented until it overflows while the same instruction stays in the I Reg 31; this permits the address register to be used as a counter to provide the display timeout function.

THE INPUT AND CONDITION LOGIC

The input and condition logic circuitry 40 receives the keyboard inputs 18 and the four MSD bits for the instruction word on lines 340, and controls branch operations and functions of this nature. The keyboard inputs 18 include $\overline{KN}$ on line 350, on which all numbers 1 to 9 appear, the $\overline{KO}$ line 351, on which zero and function keys appear, and the $\overline{KP}$ line 352 which is unused in some versions depending on programming. Each of these is inverted to produce KN, KO and KP on lines 353, 354 and 355, respectively. This keyboard input information is used in various places as will be explained. The lines 340 apply I7, I8, I9 and I10 to a set of inverters, the outputs of which are gated at devices 356 by a timed signal on line 357 which is generated from the S3$\phi$4 to S4$\phi$3 signal on line 316, inverted and clocked at $\phi 2$ and $\phi 4$ to produce an S4$\phi$4 gating signal. The gated $\overline{I7}$ to $\overline{I10}$ signals appear on lines 358 which go to logic arrangements 359 and 360 that determine "branch on 1" and branch on KO or branch on KP. Another input to the "branch on 1" logic 359 is from a condition latch 361. The condition latch is a latch or bistable circuit which is set by a number of possible inputs. One is a $\overline{C/B}$ signal on line 362 from gate 363 in the ALU 22; the condition latch is set by this path at the falling edge of a mask if there is a carry (or borrow), as for example if there is overflow or in checking to see of the mantissa is zero. Another input to set condition latch is a $\overline{F}$ signal on line 364 from flag logic 28, as when a certain flag exists. The third input 365 to set condition latch is from gate 366 which is responsive to SNO and an indication of any key down from line 367. The condition latch is reset via an input 368 which is I10; that is, the latch is reset by an instruction for branch. $\overline{I9}$ and $\overline{I10}$ from lines 358 are also applied as inputs to a control circuit 370 which functions to actuate the ACU PLA via line 371 and the flag PLA 28 via line 372; as explained in reference to FIG. 5, if I10 and I9 are 00 or 01, a branch operation is exectued, if they are at 10 it is a flag operation, and if they are all at 11 it is an arithmetic operation. These signals on lines 371 and 372 are gated by an S0$\phi$1 timing signal on line 373, so that the control is implemented at the beginning of an instruction cycle. The ACU control on line 371 is applied along with the mask signal on line 214 to a gate 374 in the ALU 22 to generate a signal on line 375 to disenable certain outputs from the ACU logic 25. Specifically, shift left, shift right, exchange A and B, and T to A, B or C are all disenabled, while A, C or C to X or Y, etc., need not be disenabled because these functions do not disturb data in the registers. The flag logic control on line 372 is applied to a gate 376 in flag logic 28, the output 377 of which functions to disenable all flag operations except the operation of "recirculate flags A and B"; which is disenabled by line 378 only when other flag operations are enabled. The flag enable gate 376 also receives the mask on line 220 from the mask logic 35.

The jump logic will now be described. The $\overline{JUMP}$ signal on line 335 is generated in a gate 380 which is clocked by a timed signal on line 381 so $\overline{JUMP}$ occurs at $S3\phi1\phi2$. Timing is also determined by input 382 which is at $V_{SS}$ at $\phi1$, $\phi2$ and at $V_{DD}$ at $\phi3$, $\phi4$. The main input 383 to gate 380 is from gate 384 which is responsive to a large number of conditions including the following: overflow of address register indicated on line 395; an indication of any key down on line 386; "Wait NO" instruction on line 387; "Wait DK" on line 388; the output of "branch on KO or KP" logic 360 appearing on line 389; and the output of "branch on 1 or 0" logic 359 appearing on line 390. The output on line 389 is responsive to a number of conditions including: $\overline{KO}$ on line 391 from line 354 gated at $S2\phi2$; I7 on line 392 and $\overline{I7}$ on one of the lines 358; KP on line 355 gated at $S2\phi2$; $\overline{I8}$ on one of the lines 358; $\overline{I9}$ and I10 from lines 358. This arrangement causes $\overline{JUMP}$ to occur if I10, I9, I8, I7 is at 1000 and a key is down in KO, or if I10, I9, I8, I7 is at 1001 and a key is down in KP. Likewise, the output 390 of "branch on 1 or branch on 0" logic 359 is responsive to the following: output 393 from condition latch 361; $\overline{I9}$ and $\overline{I10}$ on the lines 358. Thus, when I10, I9 are 00, $\overline{JUMP}$ will occur if condition latch is reset, when I10, I9 are 01, $\overline{JUMP}$ will occur if condition latch 361 is set.

Another part of the input and condition logic 40 is an arrangement for generating the Load I command on the line 329 which allows the instruction word read out of the ROM 30 at the addressed location to be loaded into the instruction register. Load I is generated from a gate 400 which is responsive to the $S3\phi4$–$S4\phi3$ timing signal on line 316 and to the output of read logic 401. The inputs to read logic 401 include the following: an input 402 from gate 403 responsive to address register overflow indication on line 385 or any key down indication on line 386; "Wait NO" on line 387; "Wait DK" on line 388; any key down indication on line 367; the inverted indication on line 404 from gate 405. Gate 405 is responsive to: an indication on line 406 from gate 407 in the ACU PLA 25 (gated by $S0\phi1$ from line 373) which is responsive to ACU enable on line 371 and Scan N on line 408; an indication of SYNC or SCAN NO on line 409; D10 on line 410 from the digit scan generator 44; and an indication on line 411 of a KN key down from line 353 gated at $S2\phi2$.

The control arrangement 346 for the address register 36, 37 is responsive to the indication on line 404 which indicates whether or not to add one. When SYNC is decoded in logic 263, add-1 is not done until D10, so the address register stays on the address of one past the SYNC address until D10. The same occurs for special instruction $\overline{SNO}$. likewise, the same occurs for $\overline{SN}$ except incrementing starts again if a KN input occurs, i.e., if a number key is down.

THE FLAG REGISTERS AND FLAG LOGIC

The flag A register 26 and flag B register 27 contained in the SAM 20 are 11 bit registers which contain one-bit status information. The output lines 440 and 441 from the SAM 20 are directly connected to Flg A and Flg B inputs to the flag logic 28, thus the flags are continuously read out each instruction cycle, one at a time, in sychronization with the state times. Likewise, Flg A and Flg B outputs 422 and 443 are connected from flag logic to the input lines 444 and 445 in the SAM. So, during each instruction cycle, the flags are transmitted through flag logic, to be set, reset, compared, etc., or merely recirculated, depending upon the flag instructions on bits I4 to I8 on lines 446 which are metallization. The horizontal lines such as 447 are P-diffusions which are broken where a diamond is shown and continuous where none is shown. Set Flg A and Flg B are provided by separate lines 447, Reset A and B by lines 448, toggle A and B by lines 449, recirculate by all of the lines 450, B to A by line 451, A to B by line 452, compare A and B by lines 453, test A by line 454 and test B by line 455. The result of a flag test or compare produces an $\overline{F}$ signal on line 364 going to the condition latch 361, by logic 456.

Special instructions Wait NO, Wait DK, SYNC and SCAN NO are handled in the logic 263 which produces outputs 460 going to input and condition logic 40.

THE ARITHMETIC CONTROL LOGIC

The ACU logic array 25 consists of a programmable logic array having inputs 446 which are I4 to I8 and their complements. The gates on line 446 in first portion 470 of the array function to select one of 32 lines 471. These lines 471 have loads 472 clocked at $S10\phi4$ on line 473 generated from S10 output 223 from the push-pull matrix 220, to conserve power. The lines 471 which are P-diffusions, become input metallization lines 474 to second part 475 of the array. Gates are selectively positioned under the lines 494 to produce outputs on lines 476 to provide the controls to the selector gates and arithmetic unit 22 as on lines 125–128, etc. The lines 476 are clocked at either $S0\phi1$ on line 477 or $S1\phi1$ on line 478, by devices 479 or 480 on both input and output, again to conserve power.

TIME OUT

The display output is turned off after a given period of time such as 15 to 20 seconds to save power and extend battery life. This is accomplished by disenabling the load I signal on line 329 so that the same instruction will stay in I Reg 31, while the address register continues to increment, once each instruction cycle, until it overflows. This counts to $2^{11}$ D times or about ½ second. Upon overflow, the I Reg is loaded into the address register 36, 37 as the next address which will cause a location in one of the SAM registers to be incremented and the cycle to repeat for perhaps 40 times, thus 20 seconds.

We claim:

1. An electronic calculator system comprising: a multiple digit display; a keyboard input means including a plurality of key switches arranged in groups; memory means including an array of memory cells; means for sequentially addressing the memory cells; arithmetic means for receiving data from the memory means and executing arithmetic functions on the data and returning it to the memory means; and means for generating timed signals for sequentially scanning the digits of the display and the groups of key switches, said, means for generating timed signals comprising a first register having a plurality of bit positions, the first register being included in said memory means and being sequentially addressed with the cells thereof, means for entering a bit in a first bit position of the first register, sequential addressing of the memory cells causing said bit in the first register to be accessed once for each time a digit of the display is activated, feedback means receiving the bit accessed from the first register upon sequential addressing thereof and for shifting such bit by one bit position before returning such bit to the first register, and means responsive to the position of the bit in the first register for selecting digit positions in the memory means for reading out digits of data from the memory means to the display.

2. An electronic calculator system according to claim 1 wherein the means for generating timed signals includes a second register, the second register being a multiple stage shift register which is stepped in sequence, once for a complete addressing sequence of the memory cell and wherein stepping of the second register is initiated when the bit in the first register is in a selected position.

3. An electronic calculator system according to claim 2 further comprising output decode menas connected to said memory means for receiving digits of data from said memory means and reading out digits of data to the display as the memory cells are sequentially addressed.

4. An electronic calculator system according to claim 3 further comprising means connected to said first register and responsive to the position of the bit in the first register for selecting digits from the memory means for loading into the output decode means.

5. In an electronic calculator of the type implemented in a large-scale-integrated semiconductor circuit, a data memory for storing multiple digit data words, means for addressing the data memory one digit at a time, a multiple digit display, output means for reading out one digit at a time from the data memory to the display, and means for generating timed signals for actuating the digits of the display one at a time including a multiple digit register associated with the data memory, the multiple digit register being connected to the means for addressing the data memory and addressed simultaneously with the data memory for circulating a bit in synchronization with the timed signals, the position of the bit in the multiple digit register correlating with the timed signals and initiating generation of a sequence of the timed signals.

6. In a calculator according to claim 5, said means for generating timed signals further including means assocaited with said register for sequentially addressing all the digits of the data memory and the register in one entire cycle for each digit read out to the display.

7. In a calculator according to claim 6, control means in the output means, responsive to the position of the bit circulating in the register for selecting the digit to be read out from the data memory to the display.

8. In a calculator according to claim 7, a multiple stage scanning register included in the means for generating timed signals and responsive to the bit being in a selected digit position for beginning a scanning cycle of said timed signals.

9. In a calculator according to claim 5, loading means connected between the data memory and the output means, the loading means loading selected digits to be displayed into the output means in the order of most-significant-digit first, one digit being loaded after each time the bit circulating in the multiple digit register shifts in position.

10. In a calculator according to claim 9, the means for addressing the data memory functioning to sequentially address the data memory in the order of least-significant-digit first.

11. In an electronic calculator of the type implemented in a large-scale-integrated semiconductor circuit, an addressible data memory for temporarily storing multiple digit data words; a multiple digit display having two sets of input terminals, an actuating signal required at both sets to actuate the display; output means for reading out data in coded form of actuating signals from the data memory to the first set of input terminals of the display; actuating means for generating actuating signals in a predetermined order to the second set of the input terminals of the display one at a time, the actuating means including a multiple digit registr coupled to the data memory and addressed therewith, the content of the multiple digit register being employed for defining which input terminal of the display is to be actuated at a given time.

12. In a calculator according to claim 11, loading means, connected between the output means and the data memory, for loading a selected digit to be displayed from the data memory into the output means in the order of most-significant-digit first, one digit being loaded for each time an actuating signal actuates a digit of the display.

13. In a calculator according to claim 12, means, connected to said actuating means, for addressing the data memory and the multiple digit register one digit at a time in the order of least-significant-digit first.

14. In a calculator according to claim 13, means, connected to said actuating means, for blanking a plurality of said actuating signals during selected periods of operation of the calculator.

15. An electronic digital system comprising:
a data memory in the form of an array of memory cells for storing a plurality of multiple digit data words;
means for addressing the array of memory cells of the data memory by applying address signals to address lines in the array of memory cells;
an array of key switches having a plurality of input terminals and a plurality of output terminals;
display means having a plurality of inputs;
scanning means for actuating in a preselected sequence certain ones of the plurality of inputs of the display means while at the same time actuating corresponding ones of the input terminals of the array of key switches in said preselected sequence;
selection means including multi-bit register means included in the scanning means for defining the particular one of said plurality of inputs of the display means which is actuated at a given time, the multi-bit register means being connected to the means for addressing the array of memory cells of the data memory to receive the address signals applied to the address lines of the array of memory cells; and input means coupled to the output terminals of the array of said key switches for detecting closure of key switches.

16. An electronic digital system according to claim 15 wherein the selection means includes a display scan register which contains a number of stages corresponding to the plurality of inputs of the display means which are actuated by the scanning means, and wherein the display scan register contains logic means for preventing actuation of selected ones of said plurality of inputs when in a nondisplaying mode to conserve system power.

17. An electronic digital system according to claim 15 wherein the data memory is addressed by said means for addressing in the order of least-signigicant-digit first, and wherein the scanning means actuates said certain ones of the plurality of inputs of the display means in the order of most-significant-digit first.

18. An electronic digital system according to claim 17 wherein the multi-bit register means includes means for shifting an accessed bit by one bit position in the direction of most-to-least-significant-digit each time the means for addressing the array of memory cells applies a complete sequence of address signals to the address lines of the array of memory cells.

19. An electronic digital system comprising:
a data memory in the form of an array of memory cells for storing a plurlity of multiple digit data words;
means for addressing the array of memory cells of the data memory by applying address signals to address lines in the array of memory cells;
an array of key switches having a plurality of input terminals and a plurality of output terminals;
display means having a plurality of input terminals;
actuating means for actuating in a preselected sequence one set of the plurality of input terminals of the display means while at the same time actuating corresponding ones of the input terminals of the array of key switches in said preselected sequence;
selection means included in the actuating means for selecting the particular one in said one set of input terminals of the display means which is to be actuated at a given time, the selection means including multi-stage memory means connected to the means for addressing the array of memory cells of the data memory to receive the address signals applied to the address lines of the array of memory cells; and
input means coupled to the output terminals of the array of said key switches for detecting closure of key switches.

20. An electronic digital system according to claim 19 wherein the multi-stage memory means contains a data bit corresponding to the particular one in said one set of input terminals of the display means which is actuated at a given time.

21. An electronic digital system according to claim 20 wherein means are provided for shifting said data bit by one bit position in the multistage memory means in a direction of from most-to-least-significant-digit each time the means for addressing the array of memory cells applies a complete sequence of address signals to the address lines in the array of memory cells.

22. An electronic calculator comprising:
a data memory in the form of an array of memory cells for storing a plurality of multiple digit data words;
means for addressing the array of memory cells of the data memory by applying address signals to address lines in the array of memory cells;
an array of key switches having a plurality of input terminals and a plurality of output terminals;
multiple digit display means having a plurality of input terminals;
actuating means for actuating in a preselected sequence one set of the plurality of input terminals of the display means while at the same time actuating corresponding ones of the input terminals of the array of key switches in said preselected sequence;
selection means included in the actuating means for selecting the particular one in said one set of input terminals of the display means which is to be actuated at a given time, the selection means including multi-stage memory means connected to the means for addressing the array of memory cells of the data memory to receive the address signals applied to the address lines of the array of memory cells;
input means coupled to the output terminals of the array of said key switches for detecting closure of said key; and
output decode and storage means, connected to the data memory and to another set of the input terminals of the display means, for converting said data words stored in said data memory into actuating signals for actuating selected ones of said another set of input terminals to provide a visual display of said data words.

23. An electronic calculator according to claim 22 wherein the multi-stage memory contains a data bit corresponding to the particular one in said one set of input terminals of the display means which is actuated at a given time.

24. An electronic calculator according to claim 23 wherein the actuating means actuates said one set of input terminals of the display means in the order of most-to-least-significant-digit.

25. An electronic calculator according to claim 22 wherein all of the circuitry of the data memory, the means for addressing the data memory, the selection means, and the output decode and storage means is contained within a single large-scale-integrated semiconductor device along with arithmetic means coupled to the data memory for permorming computational operations on the multiple digit data words. performing

* * * * *